United States Patent
Drees et al.

(10) Patent No.: US 9,135,667 B2
(45) Date of Patent: Sep. 15, 2015

(54) SYSTEMS AND METHODS FOR BUILDING ENERGY USE BENCHMARKING

(71) Applicant: Johnson Controls Technology Company, Holland, MI (US)

(72) Inventors: Kirk H. Drees, Cedarburg, WI (US); Michael J. Wenzel, Oak Creek, WI (US)

(73) Assignee: Johnson Controls Technology Company, Holland, MI (US)

( * ) Notice: Subject to any disclaimer, the term of this patent is extended or adjusted under 35 U.S.C. 154(b) by 356 days.

(21) Appl. No.: 13/679,961

(22) Filed: Nov. 16, 2012

(65) Prior Publication Data

US 2014/0142905 A1 May 22, 2014

(51) Int. Cl.
*G06F 17/50* (2006.01)
*G06Q 50/08* (2012.01)
*G06Q 10/06* (2012.01)

(52) U.S. Cl.
CPC ............ *G06Q 50/08* (2013.01); *G06F 17/5009* (2013.01); *G06Q 10/06* (2013.01); *G06Q 10/06393* (2013.01)

(58) Field of Classification Search
USPC ...................... 703/2, 6; 702/60, 61
See application file for complete search history.

(56) References Cited

U.S. PATENT DOCUMENTS

| | | | |
|---|---|---|---|
| 7,519,485 B2* | 4/2009 | MacGregor | 702/60 |
| 7,881,889 B2* | 2/2011 | Barclay et al. | 702/60 |
| 8,706,308 B2* | 4/2014 | Reichmuth et al. | 700/286 |
| 2007/0143045 A1* | 6/2007 | MacGregor | 702/61 |
| 2011/0257911 A1* | 10/2011 | Drees et al. | 702/61 |
| 2012/0084063 A1* | 4/2012 | Drees et al. | 703/6 |
| 2013/0325377 A1* | 12/2013 | Drees et al. | 702/61 |
| 2014/0142904 A1* | 5/2014 | Drees et al. | 703/2 |

OTHER PUBLICATIONS

Kissock et al., Inverse Modeling Toolkit: Numerical Algorithms, ASHRAE, 2003, 9 pages.
Lammers et al., Measuring Progress with Normalized Energy Intensity, SAE International, 2011, 11 pages.
Radiative Cooling, en.wikipedia.org/wiki/Radiative_cooling, retrieved on Jul. 20, 2012, 3 pages.
Sever et al., Estimating Industrial Building Energy Savings Using Inverse Simulation, ASHRAE, 2011, 8 pages.
Smith, Establishing a Baseline with Lean Energy Analysis, University of Dayton, Oct. 10, 2011, 29 pages.
Typical Meteorological Years, en.wikipedia.org/wiki/Typical_meteorological_year, retrieved on Jul. 20, 2012, 2 pages.

* cited by examiner

*Primary Examiner* — Thai Phan
(74) *Attorney, Agent, or Firm* — Foley & Lardner LLP

(57) ABSTRACT

Systems and methods for using an energy use model of a building for benchmarking is shown and described. An exemplary method includes receiving building data indicative of one or more characteristics of the building. The method further includes generating an energy use model for the building based on the building data and using the energy use model to generate statistics for the building. The method also includes identifying one or more other buildings having the same classification as the building. The method yet further includes comparing the generated statistics for the building to statistics for the identified one or more other buildings and providing an indication of the comparison.

24 Claims, 16 Drawing Sheets

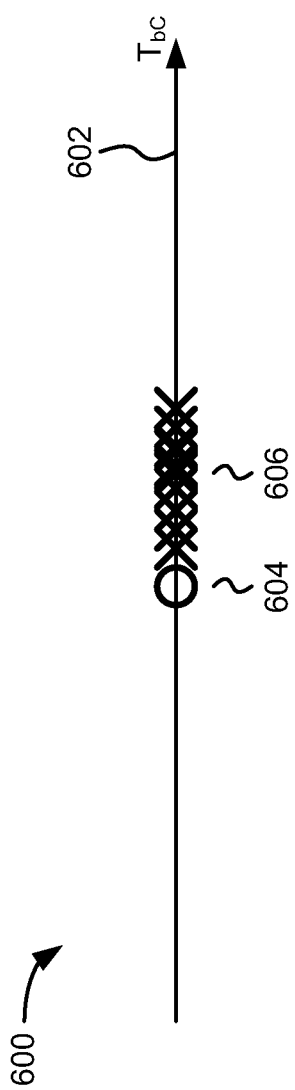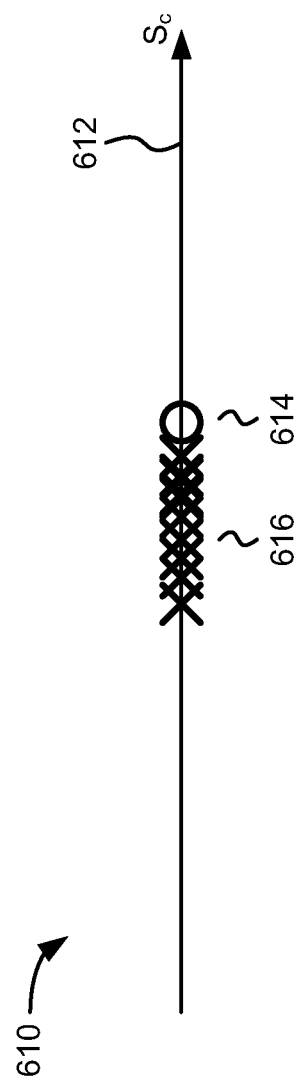

SYSTEMS AND METHODS FOR BUILDING ENERGY USE BENCHMARKING

BACKGROUND

The present disclosure generally relates to systems and methods for conducting building energy use benchmarking.

Many commercial buildings today are equipped with a variety of energy-consuming devices. For example, a commercial building may be equipped with various heating, ventilation, and air conditioning (HVAC) devices that consume energy to regulate the temperature in the building. Other exemplary types of building equipment that consume energy may include lighting fixtures, security equipment, data networking infrastructure, and other such equipment.

The energy efficiency of commercial buildings has become an area of interest in recent years. In many areas of the world, electrical generation and transmission assets have or are reaching full capacity. Because commercial buildings consume a good portion of the generated electricity in the United States and elsewhere, a major strategy for solving energy grid problems is to implement energy conservation measures (ECMs) within buildings. ECMs may also provide a financial benefit to the operator of a building, since the cost for the building's energy consumption can be reduced by implementing ECMs.

In general, ECMs involve first identifying potential areas of improvement and then taking the appropriate corrective measures. For example, the energy consumption of a building's lighting may be identified as a potential area of improvement and energy-efficient lighting may be installed in the building as an ECM. To identify potential areas of improvement, various metrics may be obtained regarding the building's energy consumption. For example, the building's energy consumption, typically measured in kilowatt-hours (kWh), or the building's energy demand, typically measured in kilowatts (kW), may be recorded and analyzed to identify trends and patterns in the building's energy use. A technician trained to analyze such data may then review the metrics for the building and suggest the implementation of one or more ECMs.

It is challenging and difficult to analyze the impact of ECMs in a building.

SUMMARY

One embodiment of the invention relates to a method for using an energy use model of a building for benchmarking. An exemplary method includes receiving building data indicative of one or more characteristics of the building. The method further includes generating an energy use model for the building based on the building data and using the energy use model to generate statistics for the building. The method also includes identifying one or more other buildings having the same classification as the building. The method yet further includes comparing the generated statistics for the building to statistics for the identified one or more other buildings and providing an indication of the comparison.

The energy use model may be a regression model. A classification for the building may be determined based on the one or more characteristics of the building. The statistics for the building may correspond to a normalized annual energy consumption intensity or a parameter vector estimated using the energy use model. The generated statistics for the building may be compared by comparing probability distribution functions of the statistics for the identified one or more other buildings. The building data may include a location of the building and the classification for the building is determined based in part on the location of the building. The building data may include an indication of a usage type for the building and the classification for the building is determined based in part on the usage type. Two or more of the generated statistics for the building may be compared to two or more of the statistics for the other buildings using multivariate statistical analysis. The method may further include determining the building to be an outlier based in part on a statistical distance measurement, such as a Mahalanobis distance, calculated using the statistics for the building and the statistics for the one or more other buildings, and providing, by the processing circuit, an indication of the determined outlier.

Another embodiment relates to a system for using an energy use model of a building. The system includes a processing circuit operable to receive building data indicative of one or more characteristics of the building, and generate an energy use model for the building based on the building data. The processing circuit is also operable to use the energy use model to generate statistics for the building. The processing circuit is further configured to identify one or more other buildings having the same classification as the building, each of the one or more other buildings having associated statistics generated from energy use models. The processing circuit is also configured to compare the generated statistics for the building to statistics for the identified one or more other buildings and to provide (e.g., output to memory, a transmitter, another system, etc.) an indication of the comparison.

Another embodiment relates to a computer-readable storage medium having machine instructions stored therein, the instructions being executable by a processor to cause the processor to perform operations. The instructions include code for receiving building data indicative of one or more characteristics of the building. The instructions also include generating an energy use model for the building based on the building data and using the energy use model to generate statistics for the building. The instructions also include computer code for determining a classification for the building based on the one or more characteristics of the building. The instructions further include computer code for identifying one or more other buildings having the same classification as the building, each of the one or more other buildings having associated statistics generated from energy use models. The instructions also include computer code for comparing the generated statistics for the building to statistics for the identified one or more other buildings. The instructions yet further include computer code for providing an indication of the comparison.

A further embodiment of the invention relates to a method for generating an energy use model of a building. The method includes receiving, at a processing circuit, building data indicative of a first type of building variable. The method also includes receiving, at the processing circuit, additional building data correlated to an energy use of the building. The method further includes determining, by the processing circuit, a portion of the building variable that is uncorrelated with the additional building data. The method additionally includes using the input data and the uncorrelated portion of the building variable to generate the energy use model of the building.

Another embodiment of the invention relates to a system for generating an energy use model of a building includes a processing circuit operable to receive building data indicative of a first type of building variable and to receive additional building data correlated to an energy use of the building. The processing circuit is also operable to determine a portion of the building variable that is uncorrelated with the additional building data. The processing circuit is further operable to use the input data and the uncorrelated portion of the building variable to generate the energy use model of the building.

Yet another embodiment of the invention relates to a computer-readable storage medium having machine instructions stored therein, the instructions being executable by a processor to cause the processor to perform operations. The operations include receiving water use data indicative of an amount of water consumed by a building. The operations also include receiving additional building data correlated to an energy use of the building. The operations further include determining an amount of consumed water that is uncorrelated with the additional building data. The operations additionally include using the input data and the uncorrelated amount of consumed water to generate the energy use model of the building.

Alternative exemplary embodiments relate to other features and combinations of features as may be generally recited in the claims.

BRIEF DESCRIPTION OF THE FIGURES

The disclosure will become more fully understood from the following detailed description, taken in conjunction with the accompanying figures, wherein like reference numerals refer to like elements, in which:

FIGS. 6A-6B are illustrations of building model parameters plotted along their respective dimensions, according to various embodiments;

DESCRIPTION

Figure 1:
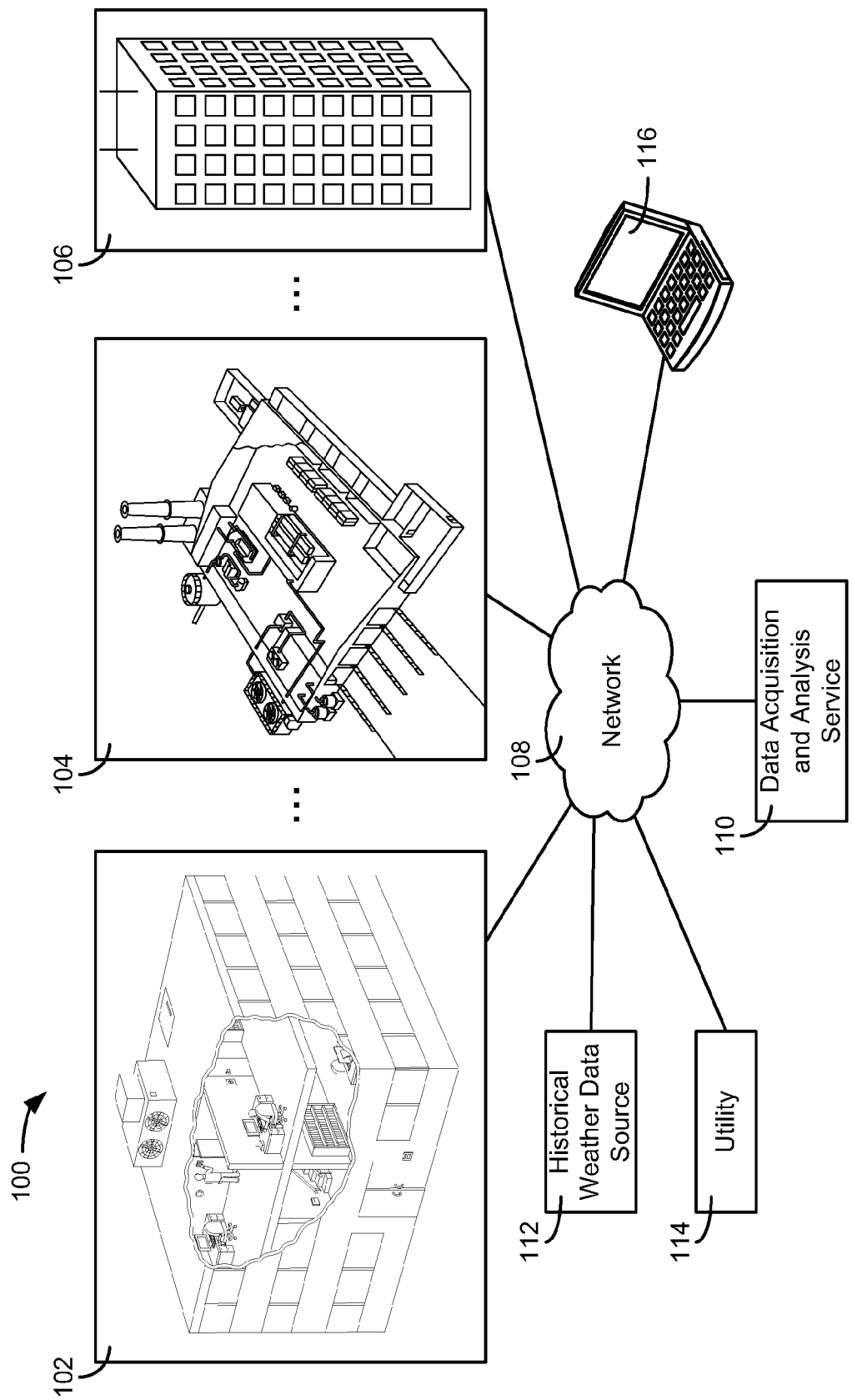
FIG. 1 is an illustration of a building data acquisition system, according to an exemplary embodiment.

Before turning to the figures, which illustrate the exemplary embodiments in detail, it should be understood that the disclosure is not limited to the details or methodology set forth in the description or illustrated in the figures. It should also be understood that the terminology is for the purpose of description only and should not be regarded as limiting.

According to various aspects of the present disclosure, the energy usage profile and energy-related characteristics of a building may be compared to those of one or more other buildings. Applicants have discovered that benchmarking a building's energy-related characteristics against those of other buildings allows for the identification of potential areas to implement ECMs, set realistic energy performance goals when implementing ECMs, and identifying best practices when implementing ECMs. For example, a building having a much higher than average energy consumption in comparison to similar buildings may be identified as a good candidate for ECMs.

In some embodiments, a building's energy usage profile may be modeled by using the building's energy-related characteristics as inputs to the model. Based on the known characteristics of the building, other model parameters may be predicted (e.g., statistical values related to the building's energy use). Such a model may be part of an energy-conservation strategy that uses lean energy analysis. Lean energy analysis, as presented in the embodiments of this application, attempts to achieve the maximum utility from building-related data for as little cost as possible. Thus, the model may use a small amount of widely available data to model the energy usage profile of a building, in contrast to performing an expensive energy audit of the building's operations. For example, the model may be based in part on data regarding the weather where the building is located and billing data from a utility supplying energy to the building. Another example of readily available data includes billing data regarding the building's water use.

Statistics derived from a building's energy use model may be compared to those of similar buildings. For example, the statistics may be compared to identify outlier statistics for building. Generally, buildings may be considered similar if they are located in the same type of climate, have the same or similar usage type (e.g., both buildings are schools, office buildings, etc.), or share other such characteristics. Univariate or multivariate statistical analysis may be used to compare a building's statistics to the statistics of other buildings deemed to be similar to it. This comparison may be used, for example, to identify how well the building's energy efficiency compares to the similar buildings, to set realistic expectations when implementing ECMs, and perform other functions.

Various reports may be generated based on the comparison between a building and one or more other similar buildings. For example, a report may quantify the energy costs for the building in relation to the similar buildings (e.g., the energy costs for the building versus the average of its peer buildings). A report may also be generated and used to identify opportunities to implement ECMs. For example, a building may be identified as being a potential candidate for ECMs if the building is in the top 10% for energy consumption among its peers. In some embodiments, an equipment fault in the building may be identified via a report based on one or more of the building's statistics being a statistical outlier when compared to that of peer buildings.

Building Data Acquisition and Analysis

Referring now to FIG. 1, an illustration of a building data acquisition system 100 is shown, according to an exemplary embodiment. Generally, building data acquisition system 100 is configured to record, store, and analyze building data related to a building's energy use. In various embodiments, building data for a building may be used to model the building's energy usage profile and predict related parameters. Comparisons may also be made in building data acquisition system 100 between the building data and model parameters of different buildings.

As shown, building data acquisition system 100 may include any number of buildings 102-106 (e.g., a first through nth building). Buildings 102-106 may also include any number of different types of buildings, such as various types of commercial buildings. For example, building 102 may be an office building, building 104 may be a manufacturing facility, and building 106 may be a hospitality facility, such as a hotel. Other exemplary buildings in buildings 102-106 may include, but are not limited to, data centers, schools, shipping facilities, and government buildings. Buildings 102-106 may include any combination of the different building types. For example, buildings 102-106 may include ten office buildings, twenty manufacturing facilities, and thirty hospitality facilities.

Buildings 102-106 may be located within the same geographic regions as one another or across different geographic regions. For example, building 102 and building 104 may be located in the same city, while building 106 may be located in a different city. Different levels of granularity may be used to distinguish buildings 102-106 as being located in the same geographic region. For example, geographic regions may be divided by country, state, city, metropolitan area, time zone, zip code, area code, latitude, longitude, growing zone, combinations thereof, or using any other geographic classification system. According to one embodiment, a building's geographic location may be used as a proxy for its climatic zone. For example, data regarding a building's location in Hawaii may be used to determine that the building is located in a tropical climate.

Buildings 102-106 may be equipped with sensors and other monitoring devices configured to measure building data related to the building's energy consumption. For example, buildings 102-106 may have devices (e.g., computing devices, power meters, etc.) configured to measure the water consumption, energy consumption, and energy demand of the buildings. Other forms of building data may include the measured temperature in the zones of a building, the dimensions of the building (e.g., square footage, etc.) and any other measured value that relates to the building's energy usage profile. In some cases, building data may also include data used in a building's automation system. For example, building data may also include control parameters, such as temperature set points used to regulate the temperate in a building and timing data used to automatically turn on or off parts of the lighting within the building at various times (e.g., the lights may be turned off in an area of the building at night).

According to various embodiments, readily available data may be used to determine and model a building's energy consumption. For example, billing data may be received from a utility 114 (e.g., billing data from the utility) that indicates the building's energy consumption, the financial costs associated with the energy consumption, etc. In keeping with the principles of lean energy analysis, billing data from a utility and other forms of readily available data may be used to model and analyze a building's energy consumption. Such an approach may simplify and reduce the cost of performing the energy analysis over approaches that rely heavily on sensor data from a building.

Building data may include data regarding the weather where a building is located. In some embodiments, the weather data may be generated by weather-sensing equipment at buildings 102-106. For example, building 104 may be equipped with temperature sensors that measure the building's external temperature. In some embodiments, building data may include weather data received from a weather data source located in proximity to the building. In further embodiments, building data may include weather data for a typical meteorological year (TMY) received from a historical weather data source 112 (e.g., a computer system of the National Oceanic and Atmospheric Administration or similar data source). In the United States of America, the first set of TMY data was collected between 1948-1980 from various locations throughout the country. A second set of TMY data (TMY2), which also includes data regarding precipitable moisture, was collected between 1961-1990. In addition, a third set of TMY data (TMY3), was collected from many more locations than TMY2 data over the span of 1976-1995. Regardless of the version used, TMY data may be used to compare current conditions to normal or predicted conditions, in some embodiments. In further embodiments, TMY data may be used to predict future conditions of a building (e.g., by using the historical data to predict typical future weather conditions) or future energy consumptions by a building. For example, TMY data may be used to predict an average outdoor temperature change for a building during the upcoming month of March. TMY data may be stored by the building automation systems of buildings 102-106 or data acquisition and analysis service 110 and used to model the heating and cooling needs of buildings 102-106. As used herein, "TMY data" may refer to any version or set of TMY data (e.g., TMY2 data, TMY3 data, etc.).

Network 108 may be any form of computer network that relays information between buildings 102-106 and a data acquisition and analysis service 110. For example, network 108 may include the Internet and/or other types of data networks, such as a local area network (LAN), a wide area network (WAN), a cellular network, satellite network, or other types of data networks. Network 108 may also include any number of computing devices (e.g., computer, servers, routers, network switches, etc.) that are configured to receive and/or transmit data within network 108. Network 108 may further include any number of hardwired and/or wireless connections. For example, building 102 may communicate wirelessly (e.g., via WiFi, ZigBee, cellular, radio, etc.) with a transceiver that is hardwired (e.g., via a fiber optic cable, a CAT5 cable, etc.) to other computing devices in network 108.

Data acquisition and analysis service 110 may be one or more electronic devices connected to network 108 configured to receive building data regarding buildings 102-106 (e.g., either directly from buildings 102-106 or from another computing device connected to network 108). In various embodiments, data acquisition and analysis service 110 may be a computer server (e.g., an FTP server, file sharing server, web server, etc.) or a combination of servers (e.g., a data center, a cloud computing platform, etc.). Data acquisition and analysis service 110 may also include a processing circuit configured to perform the functions described with respect to data acquisition and analysis service 110. The building data may be received by the processing circuit of data acquisition and analysis service 110 periodically, in response to a request for the data from data acquisition and analysis service 110, in response to receiving a request from a client device 116 (e.g., a user operating client device 116 may request that the building data be sent by the computing device), or at any other time.

Data acquisition and analysis service 110 may be configured to model the energy usage profiles of buildings 102-106 using the received building data, according to various embodiments. For example, data acquisition and analysis service 110 may utilize lean energy analysis (e.g., using readily available data, such as utility billing data) to model the energy usage profiles of buildings 102-106. In some embodiments, data acquisition and analysis service 110 may use the received building data in an inverse building energy model that uses weather data as an independent variable and energy bill data divided by the area of the building as the dependent variable. In other words, the model may make use of historical weather data to predict the energy costs for the building using lean energy analysis. Data acquisition and analysis service 110 may also generate and provide various reports to client 116, which may be located within one of buildings 102-106 or at another location.

In other embodiments, data acquisition and analysis service 110 may be implemented at one or more of buildings 102-106. For example, data acquisition and analysis service 110 may be integrated as part of the building automation system of buildings 102-106 (e.g., as part of a distributed implementation). In such a case, building data may be shared by the computing devices in buildings 102-106 that implement the functions of data acquisition and analysis service 110 with one another via network 108. For example, computing devices at buildings 102-106 may be configured to collaboratively share building data regarding their respective building's energy consumption and demand. The sharing of building data among the buildings' respective computing devices may be coordinated by one or more of the devices, or by a remote coordination service. For example, a remote server connected to network 108 may coordinate the sharing of building data among the electronic devices located at buildings 102-106.

Figure 2:
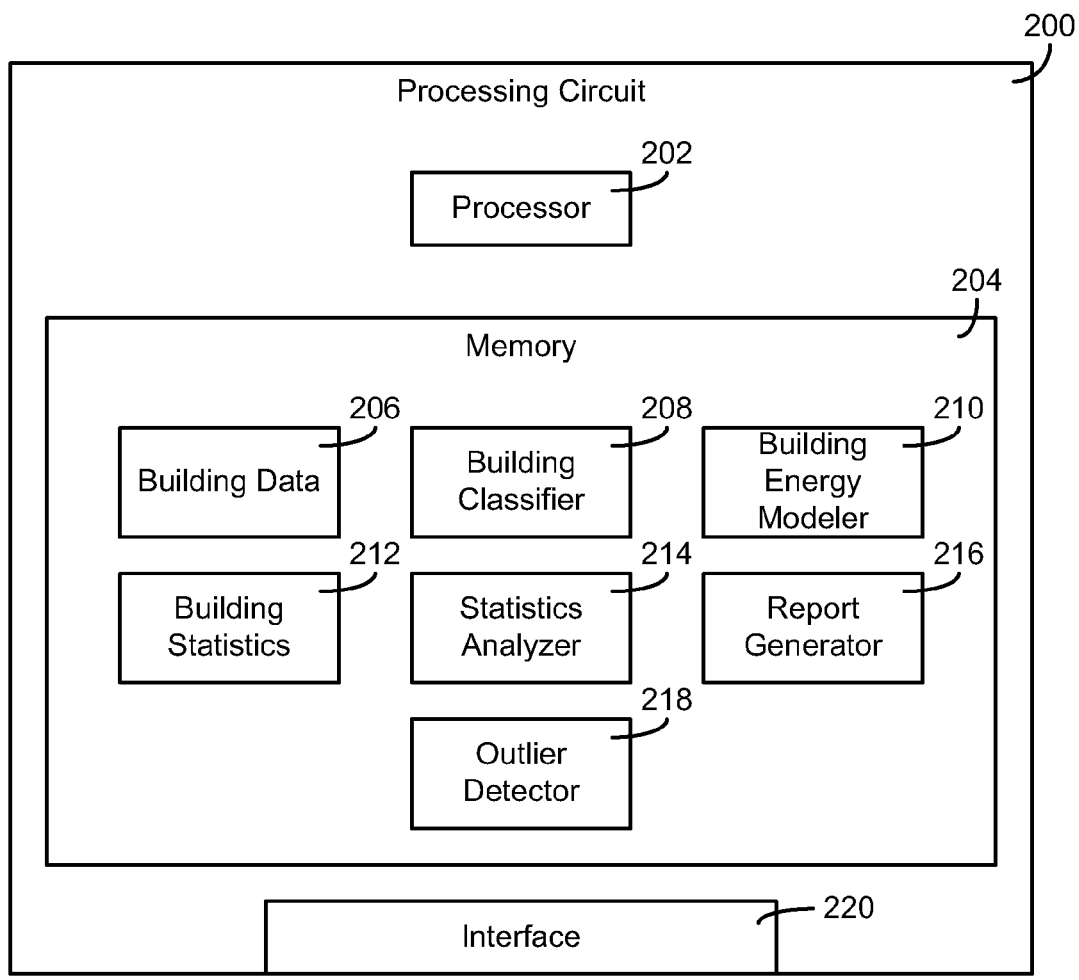
FIG. 2 is a block diagram of a processing circuit configured to analyze energy-related statistics of a building, according to an exemplary embodiment.

Referring now to FIG. 2, a block diagram of a processing circuit 200 configured to analyze energy-related statistics of a building is shown, according to an exemplary embodiment. In various embodiments, processing circuit 200 may be a component of a data acquisition and analysis service (e.g., data acquisition and analysis service 110 in FIG. 1) or any other computing device configured to analyze energy-related characteristics and statistics of a building.

Processing circuit 200 includes processor 202 and memory 204. Processor 202 may be or include one or more microprocessors (e.g., CPUs, GPUs, etc.), an application specific integrated circuit (ASIC), a circuit containing one or more processing components, a group of distributed processing components (e.g., processing components in communication via a data network or bus), circuitry for supporting a microprocessor, or other hardware configured for processing data. Processor 202 is also configured to execute computer code stored in memory 204 to complete and facilitate the activities described herein. Memory 204 can be any volatile or non-volatile computer-readable storage medium, or combinations of storage media, capable of storing data or computer code relating to the activities described herein. For example, memory 204 is shown to include computer code modules such as a building classifier 208, a building energy modeler 210, a statistics analyzer 214, a report generator 216, and an outlier detector 218. When executed by processor 202, processing circuit 200 is configured to complete the activities described herein.

Processing circuit 200 also includes a hardware interface 220 for supporting the execution of the computer code building classifier 208, building energy modeler 210, statistics analyzer 214, report generator 216, and outlier detector 218. Interface 220 may include hardware configured to receive data as input to processing circuit 200 and/or communicate data as output to another computing device. For example, processing circuit 200 may receive building data 206 from one or more sensors, databases, or remote computing devices. Interface 220 may include circuitry to communicate data via any number of types of networks or other data communication channels. For example, interface 220 may include circuitry to receive and transmit data via a wireless network or via a wired network connection. In another example, interface 220 may include circuitry configured to receive or transmit data via a communications bus with other electronic devices.

Memory 204 may include building data 206. In general, building data 206 may include any data relating to the characteristics of one or more buildings. In some embodiments, building data 206 may include sensor data generated by sensors associated with one or more buildings. Sensor data may include, but is not limited to, data regarding the energy use by the building (e.g., a measured demand, a measured consumption, etc.), a measured humidity or temperature internal or external to the building, security system data (e.g., a video feed, access logs, etc.), or a measured water use by the building. Associated with such data may also be a financial cost (e.g., an energy cost based on the building's energy usage).

Building data 206 may include billing data from one or more utilities that supply the building. For example, building data 206 may include billing data from a utility that provides the building with electrical power. In another example, building data 206 may include billing data from a utility that supplies water to the building.

Building data 206 may include data from a building's control system, such as set point data (e.g., temperature set points, energy use set points, etc.), control variables or parameters, and calculated metrics from the building's control system. In some cases, this data may be used by processing circuit 200 to determine or predict a building's energy use or to detect excessive consumption. For example, processing circuit 200 may determine that a building's HVAC system is consuming excessive energy.

Building data 206 may include data regarding the physical characteristics of a building. For example, building data 206 may include data regarding the building's geographic location (e.g., street address, city, coordinates, etc.), dimensions (e.g., floor space, stories, etc.), use type (e.g., office space, hospital, school, etc.), or building materials. Similarly, building data 206 may include weather data for a building's geographic location, in some embodiments. For example, building data 206 may include weather data indicative of the climate where the building is located (e.g., the building is in a tropical climate, in a temperate climate, etc.). The weather data may be, or may include, TMY data, in various embodiments. The weather data may also include historical weather measurements from near-by the building's location. This may be obtained from either on-site sensors or an archived data from other nearby locations (e.g., airports, national weather stations, etc.).

Memory 204 may include building classifier 208. Building classifier 208 may be configured to categorize a building using building data 206 and to identify one or more similar buildings. In various embodiments, building classifier 208 may compare one or more characteristics of a building to that of one or more other buildings, to determine whether the buildings are similar. Characteristics compared by building classifier 208 may include, but are not limited to, the climates where the buildings are located, the usage types of the buildings, or the dimensions of the buildings. For example, office buildings that are both located in tropical climates may be classified as being similar to one another by building classifier 208. In some cases, a building's climate may affect the building's systems (e.g., HVAC) and building codes, which may also influence the building's energy use. For example, a building in a tropical climate may include HVAC cooling systems and operate primarily to cool the building. Similarly, a building's usage type may also affect the building's energy use. For example, a data center may use more energy than a school, due to the extra power consumed by the data center's computing devices.

In one embodiment, building classifier 208 may classify buildings belonging to the same enterprise as being similar. In some cases, an enterprise may use the same building design or similar building design through the enterprise. For example, branches of a bank may have the same or similar building designs. In another example, franchise locations of a fast-food restaurant may have the same or similar building designs. Such a classification may be based solely on the respective buildings' layouts being the same or may be based on one or more additional factors. For example, only buildings of an enterprise that are located in the same climate may be classified as being similar by building classifier 208.

Memory 204 may include building energy modeler 210 configured to model the energy use of a building using one or more building characteristics in building data 206. Any form of model may be used by building energy modeler 210 to model a building's energy use. For example, building energy modeler 210 may use parametric models (linear regression, non-linear regression, etc.), nonparametric models (neural networks, kernel estimation, hierarchical Bayesian, etc.), or something in between, such as a Gaussian process model to model a building's energy use, according to according to various embodiments.

In one embodiment, building energy modeler 210 models the energy use of a building using linear regression. In various implementations, building energy modeler 210 may model the energy use (E) of a building as follows:

$$E = \beta_0 + \beta_1 x_1 + \ldots + \beta_n x_n + \epsilon$$

where E is the dependent variable representing the energy use (e.g., measured in kilowatt-hours), $x_i$ is an independent variable, $\beta_i$ is an element of the parameter vector, and $\epsilon$ is an error factor (e.g., a noise factor). In other words, any number of independent variables may be used by building energy modeler 210 (e.g., weather data, occupancy data, etc.) within an energy use model to model a building's energy use.

Building energy modeler 210 may use any number of different estimation techniques to estimate the values of parameter vectors ($\beta_i$) used in a parametric energy use model. In some embodiments, building energy modeler 210 may use a partial least squares regression (PLSR) method to determine the parameter vectors. In further embodiments, building energy modeler 210 may use other methods, such as ridge regression (RR), principal component regression (PCR), weighted least squares regression (WLSR), or ordinary least squares regression (OLSR). Generally, a least squares estimation problem can be stated as follows: given a linear model $$Y = X\beta + \epsilon, \quad \epsilon \sim N(0, \sigma^2 I)$$

find the vector $\hat{\beta}$ that minimizes the sum of squared error RSS:

$$RSS = \|Y - X\hat{\beta}\|^2$$

In the above equations, Y is a vector that contains the individual n observations of the dependent variable and X is a n by p+1 matrix that contains a column of ones and the p predictor variables at which the observation of the dependent variable was made. $\epsilon$ is a normally distributed random vector with zero mean and uncorrelated elements. According to various exemplary embodiments, other methods than using PLSR may be used (e.g., weighted linear regression, regression through the origin, etc.)

The optimal value of $\hat{\beta}$ based on a least squares estimation has the solution:

$$\hat{\beta} = (X^T X)^{-1} X^T Y$$

where $\hat{\beta}$ is a normal random vector distributed as:

$$\hat{\beta} \sim N(\beta, \sigma^2 (X^T X)^{-1}).$$

The resulting sum of squared error divided by sigma squared is a chi-square distribution:

$$\frac{RSS}{\sigma^2} \sim \chi^2_{n-(p+1)}.$$

The difference in coefficients is distributed as:

$$\Delta \beta = \hat{\beta}_1 - \hat{\beta}_2 \sim N(0, \sigma^2 [(X_1^T X_1)^{-1} + (X_2^T X_2)^{-1}]).$$

The quadratic form of a normally distributed random vector where the symmetric matrix defining the quadratic form is given by the inverse of the covariance matrix of the normal random vector is itself a chi-square distributed random variable with degrees of freedom equal to the length of $\Delta \beta$:

$$\frac{\Delta \beta^T \left[ (X_1^T X_1)^{-1} + (X_2^T X_2)^{-1} \right]^{-1} \Delta \beta}{\sigma^2} \sim \chi^2_{p+1}.$$

Additionally, the sum of two independent chi-square distributions is itself a chi-square distribution with degrees of freedom equal to the sum of the degrees of freedom of the two original chi-square distributions. Thus, the sum of the two root sum squared errors divided by the original variance is chi-square distributed, as:

$$\frac{RSS_1 + RSS_2}{\sigma^2} \sim \chi^2_{n_1 + n_2 - 2(p+1)}.$$

$n_1$ and $n_2$ are the number of data points used to estimate the model coefficients $\hat{\beta}_1, \hat{\beta}_2$.

Building energy modeler 210 may store parameter estimates and other data associated with the energy use model as building statistics 212. For example, building statistics 212 may include the determined model parameters ($\beta_i$), energy use (E), and any associated error measurements, such as a calculated RSS or coefficient of variation of a root mean square deviation (CVRMSE) score. In some embodiments, building energy modeler 210 may also use the model to generate other statistics regarding a building, such as an outdoor air flow rate, temperature set point, etc.

According to various embodiments, building energy modeler 210 may generate normalized statistics and store the generated statistics in building statistics 212. For example, energy use statistics may be normalized by building energy modeler 210 to account for changes in the weather at a building's location. In some embodiments, building energy modeler 210 may calculate normalized energy use of a building by driving the building's model using TMY data. A cooling or heating degree day value may also be used by building energy modeler 210. Generally, cooling degree days are calculated by integrating the positive difference between the time varying outdoor air temperature and the building's cooling breakeven temperature. Similarly, heating degree days are calculated by integrating the positive difference between the heating breakeven temperature and the time varying outdoor air temperature. Breakeven temperature corresponds to a single outdoor air temperature that coincides with the onset of the need for mechanical heating or cooling within the building. The integration interval is typically one month but other intervals may be used. For example, a cooling degree day (CDD) may be calculated as follows:

$$CDD = \int^{month} \text{Max}\{0, (T_{OA} - T_{BE})\} dt$$

where $T_{OA}$ is the outdoor air temperature of the building and $T_{BE}$ is the cooling breakeven temperature as previously defined. An alternative for calculating cooling or heating degree days is to assume a breakeven temperature (e.g. cooling breakeven temperature of 65° F.) regardless of the building characteristics. This approach is commonly used where breakeven temperatures are calculated based on geographical location (e.g. by city) in lieu of actual building characteristics. This approach is less accurate for building modeling but is common. Degree days may be used in the linear regression model by building energy modeler 210 as a dependent variable (e.g., as $x_1$). Degree days can also be used as statistics for benchmarking.

Understanding that the predicted consumption and model coefficients obtained from building energy modeler 210 are actually normally distributed random variables with calculable mean and variance allows exemplary statistics that may be generated and stored in building statistics 212 to include mean and variance of: β and energy intensity values obtained by using billing data divided by area as the dependent value in building energy modeler 210 and the normalized annual consumption intensity ($I_{NAC}$) values obtained using the β intensity values driven by TMY data as the independent data input(s).

Memory 204 may include statistics analyzer 214 configured to analyze and compare statistics between two or more buildings. In some embodiments, statistics analyzer 214 may compare building statistics for buildings having the same or similar classifications, as determined by building classifier 208. For example, statistics analyzer 214 may compare one or more of a building's statistics in building statistics 212 to those buildings having the same climate and usage type (e.g., statistics for a data center located in a tropical climate may be compared to other data centers located in tropical climates).

Statistics analyzer 214 may perform univariate or multivariate statistical analysis on building statistics 212, according to various embodiments. In general, univariate statistical analysis refers to the analysis and comparison of a single type of statistic. Exemplary statistics that may be compared may include, but are not limited to, normalized annual consumption intensity ($I_{NAC}$) values for the buildings and intensities for β values (e.g., the energy use model coefficients) of the same type from the buildings' respective models (e.g., the intensities of the β values relating to weather data, the β values relating to the bill data divided by area, etc.). Multivariate statistical analysis, in contrast, allows multiple parameters used in a building's model to be analyzed together. For example, statistics analyzer 214 may compare vectors of model parameters instead of singular model parameters, in some embodiments.

To compare normalized statistics for a class of buildings, the same TMY data for the class may be used by building energy modeler 210 to model the buildings in the class, according to some embodiments. In some embodiments, the mean and standard deviation of a particular type of statistic for buildings having the same classification may be determined by statistics analyzer 214. In other embodiments, statistics analyzer 214 may instead calculate robust estimators of the mean and standard deviation. For example, statistics analyzer 214 may determine a robust estimator of the mean when using multivariate statistical analysis on building statistics 212. Statistics analyzer 214 may use the calculated mean and standard deviations, or robust estimates thereof, to define a probability density function for a building statistic for a given class of buildings. Statistics analyzer 214 may also determine confidence intervals for the building statistic under analysis. In general, a confidence interval provides a range of values in which the true value of an estimate is likely to exist. For example, a 95% confidence interval may be a range of values where the true value is likely to be within the given range with a confidence of 95%.

Memory 204 may include outlier detector 218 configured to detect an outlier statistic among the statistics compared by statistics analyzer 214. In some embodiments, one or more statistics of a test building may be compared to the probability distribution of those statistics for the other buildings in the same class as the test building. For example, outlier detector 218 may determine that a building's statistic is an outlier for the class based on how many standard deviations the statistic is above or below the mean for the distribution. In some embodiments, outlier detector 218 may use a robust estimator of the mean and covariance from statistics analyzer 214 to detect an outlier. If univariate statistical analysis is used to compare building statistics, outlier detector 218 may use any number of outlier detection techniques to identify an outlier value. For example, outlier detector 218 may use a generalized extreme studentized deviate test (GESD), Grubb's test, or any other form of univariate outlier detection technique. In some cases outliers may be determined simply as the top or bottom fixed percentile of the building statistics (e.g., the lowest 5% of the buildings may be deemed outliers).

In some embodiments, outlier detector 218 may use a distance value between statistics, to detect an outlier. For example, outlier detector 218 may determine a Gaussian or Mahalanobis distance to compare statistics. Such a distance may represent a statistical distance away from the typical building in the class. If the Mahalanobis distance for a test building is above a critical value, outlier detector 218 may generate an indication that the building's one or more statistics are outliers in relation to the other buildings in the class. In some embodiments, outlier detector 218 may project the distance onto the vector directions defining changes in a building's parameters to determine the root cause. Other outlier detection techniques that may be used by outlier detector 218 include, but are not limited to, Wilkes' method (e.g., if multivariate analysis is used) and various cluster analysis techniques.

Outlier detector 218 may be configured to detect excessive consumption by a building. In some embodiments, outlier detector 218 may perform one or more null hypothesis tests using building statistics 212 and a building's model generated by building energy modeler 210. In general, hypothesis testing allows for the detection of an observed value that is statistically significant (e.g., the result is not a function of random chance). Exemplary hypothesis tests include F-tests and chi-squared tests. In some embodiments, hypothesis testing may be used to test one or more values against a baseline, as described in U.S. patent application Ser. No. 13/252,092 entitled "Systems and Methods for Detecting Changes in Energy Usage In a Building" and filed on Oct. 3, 2011, the entirety of which is hereby incorporated by reference.

Memory 204 may include report generator 216 configured to generate a report using data from statistics analyzer 214 and/or outlier detector 218. A report generated by report generator 216 may be, but is not limited to, graphs (e.g., bar graphs, box and whisker graphs, etc.), tables, textual reports, and other forms of graphical representations of the compared statistics for a test building and those of other buildings in the same class. For example, report generator 216 may generate a graph of a probability distribution of a statistic for the class of buildings that includes an indication of where the test building's statistic falls within the distribution. A report generated by report generator 216 may include an indication of a detected outlier statistic from outlier detector 218, in some embodiments.

Report generator 216 may provide a generated report to an electronic display directly or indirectly via interface 220. For example, report generator 216 may provide a generated report directly to an electronic display connected to interface 220. In another example, report generator 216 may provide a generated report to a remote device for display on the device's display (e.g., the report may be provided to a remote device connected to processing circuit 200 via a network). In a further example, report generator 216 may provide a generated report to a printer via interface 220.

In some cases, a report generated by report generator 216 may be used to set realistic priorities and goals when implementing ECMs (e.g., by upgrading a building's HVAC equipment to more energy-efficient equipment). For example, assume that a report generated by report generator 216 indicates that a building's energy use is in the ninety-ninth percentile among buildings in its class. In such a case, the mean statistic for the class' probability distribution may provide an estimate for the expected improvement to the test building's energy use, should ECMs be implemented.

In further cases, a report generated by report generator 216 may be used by an individual to identify potential equipment faults. For example, a building that has already implemented ECMs and has an energy use that is statistically higher than a threshold value may be identified as possibly having an equipment fault. In various embodiments, a report may generally identify a building as being a statistical outlier among its class (e.g., indicating that further analysis may be needed) or may even include diagnostic information that may be used by a technician to correct the abnormality (e.g., the report may indicate that a building's rate of heating or cooling is lower than other buildings in its class, etc.).

Univariate Analysis of Building Statistics

In various embodiments, a single statistic derived from a building's energy use model may be compared to those of other buildings in the building's class. For example, a value relating to the building's energy use may be compared statistically to those of other buildings in the same class (e.g., by comparing normalized annual consumption intensities, etc.). Similarly, other statistics generated by building energy modeler 210 may be compared to the corresponding value from other buildings in the same class (e.g., the intensity of $\beta_0, \beta_1$, etc.). Such a comparison may be used, for example, to determine whether the building is a good candidate for ECMs, to set realistic expectations when implementing ECMs, or to determine whether a potential fault exists in the building's equipment.

Figure 3:
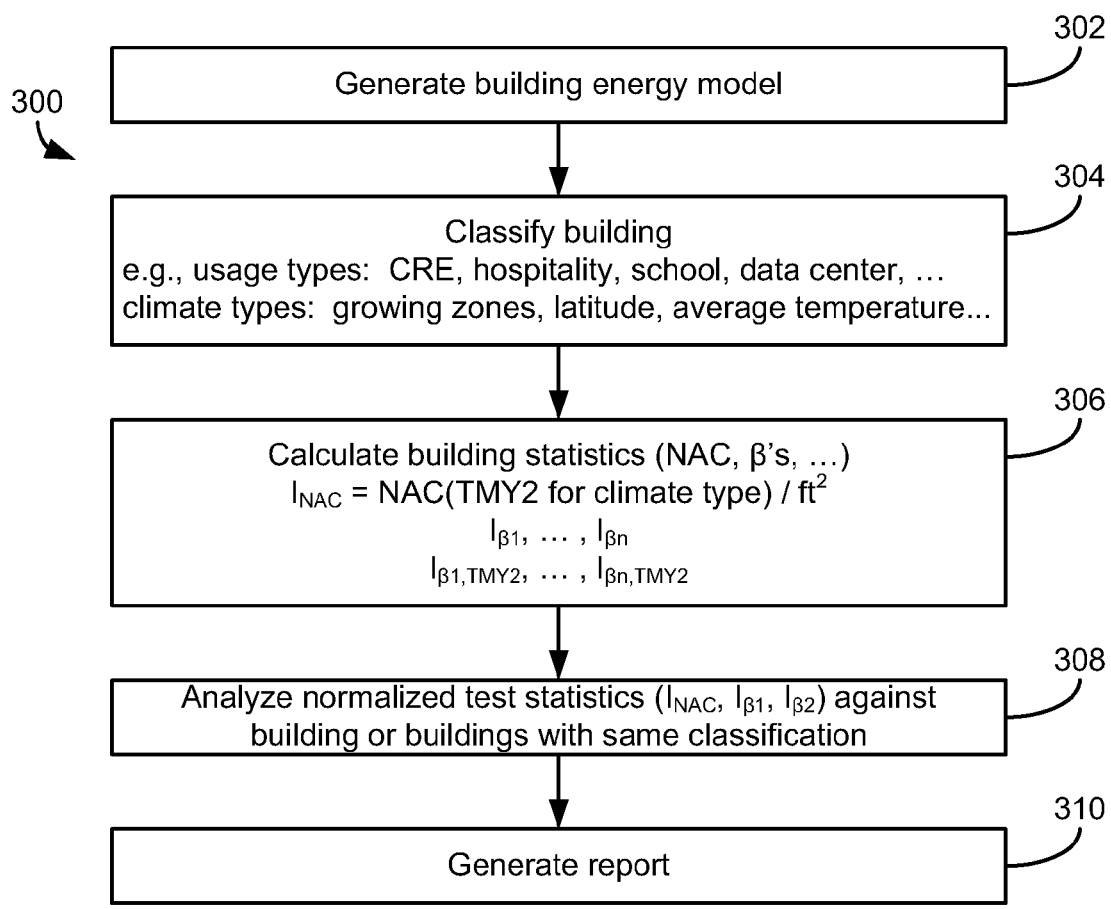
FIG. 3 is a flow chart of a process for analyzing energy-related statistics of a building, according to one embodiment.

Referring now to FIG. 3, a flow chart of a process 300 for analyzing energy-related statistics of a building is shown, according to one embodiment. Process 300 may be implemented by one or more computing devices, such as by a data acquisition and analysis service, by a building's control system, or the like. Generally, process 300 allows for a value derived from a building's energy use model to be compared to those of similar buildings.

Process 300 includes generating a building energy model for a building (step 302). In various embodiments, the energy model may be a regression model that uses a value relating to the building's energy use as the dependent variable. Any number of independent variables that may affect the building's energy use (e.g., weather data for the building's location, the building's occupancy, etc.) may be used in the model. In a simple example using only weather data as an independent variable, a building's energy use may be modeled as follows:

$$E = \beta_0(\#days) + \beta_1(CDD) + \ldots + \epsilon_1$$

where E is the dependent variable representing the building's energy use, CDD is a cooling degree day value for the building, $\beta_0$ is a first parameter, $\beta_1$ is a second parameter corresponding to the weather-related input, and $\epsilon_1$ is an error factor (e.g., a noise factor). For example, actual outdoor air temperature measurements for the building may be used to determine the building's CDD or HDD data. In general, the optimal value of $\hat{\beta}$ for the model based on a least squares estimation has the solution:

$$\hat{\beta} = (X^T X)^{-1} X^T Y$$

where X represents the actual weather data for the building and Y represents the billing data for the building. In one embodiment, billing data used as the independent variable, E, may be divided by the building's area (e.g., to determine an energy use per unit of floor area, such as $ft^2$).

Process 300 may include classifying the building and one or more other buildings (step 304), in some embodiments. Any number of combinations of a building's characteristics may be used to classify the building. In some embodiments, buildings may be classified by usage type. For example, a building may be classified as a commercial real estate (CRE) building (e.g., office building), a hospitality building (e.g., a hotel), a school, a data center, etc. A building's usage type may indicate the types of equipment in the building that may affect the building's energy use. For example, a data center may have a higher energy use than a school, due to the energy demands of the servers in the data center.

In some embodiments, a building may be classified by the climate where the building is located. In one embodiment, location data for the building may be used to determine the climate for the building's location. For example, location data for a building may include the building's zip code, area code, street address, latitude, longitude, city, state, country, building codes, or any other form of location data. In general, a building's climate may affect the building's HVAC configuration (e.g., the equipment of a building in a tropical climate may primarily operate to cool the internal temperature of the building). A building's climate may also affect the energy use by the building's HVAC equipment, due to weather fluctuations (e.g., by affecting the amount of heating or cooling needed to maintain an internal temperature set point relative to the outdoor temperature).

Historical weather data may be associated with a building's climate or location. In some cases, the historical weather data may be recorded directly by the building's equipment (e.g., a measured outdoor air temperature, a measured outdoor humidity, etc.). In other cases, the historical weather data may be weather data measured over the course of decades. For example, a single set of representative TMY data could be used to determine normalized annual consumption (NAC) intensity statistics for the building and the other buildings with the same classification. Such a value may be determined, for example, using the least squares estimation corresponding to:

$$\hat{I}_{NAC} = \hat{\beta}^T X_{TMY}$$

$$X_{TMY} = \begin{bmatrix} n_{days/yr} \\ CDD_{TMY,yr} \\ HDD_{TMY,yr} \end{bmatrix}$$

where $CDD_{TMY}$ and $HDD_{TMY}$ are cooling and heating degree days calculated using TMY data and β is determined from building energy modeler 210 where the independent variable data is normalized by floor area and is time synchronized with the dependent variable data.

Process 300 includes calculating building statistics for the buildings under analysis (step 306). The buildings under analysis may include a plurality of buildings belonging to the same class, in one embodiment. For example, building statistics for a school located in a moderate climate and one or more other schools located in the same climate may be calculated. In some embodiments, the statistics may be normalized, allowing a direct comparison of the statistics to be made between a test building and other buildings in the same class.

In various embodiments, a building's energy model may be a regression model that can be solved to determine a building's statistics. For example, a parameter estimation technique (e.g., PLSR, OLSR, RR, etc.) may be used to estimate the $\beta_i$ parameters in the building's energy use model. Calculations may also be made to evaluate the reliability of the model and/or to detect abnormal values that depart from the model (e.g., statistics regarding the model itself). For example, a coefficient of determination, t-statistic, f-statistic, or other evaluative measurement may also be calculated with the building's energy use model. Other forms of energy use models may also be used (e.g., a non-linear model, etc.) and their resulting values used to derive the building statistics.

In general, building statistics may correspond to any value derived from the building's energy use model. For example, a building statistic may be a normalized annual consumption intensity ($I_{NAC}$) value or an intensity value for one of the model's $\beta_i$ parameters, if a regression model is used to model the building's energy use. Further exemplary building statistics that may be derived from a building's energy use model may include, but are not limited to, the building's thermal efficiency (η), the building's thermal conductance area product (UA), temperature set point ($T_{setpt}$), outdoor air flow ($Flow_{OA}$), or other such values.

Process 300 includes analyzing one or more of the normalized test statistics for the buildings under study and for the buildings having the same classification (step 308). In some embodiments, a probability density function may be generated for the buildings having a particular classification. For example, a probability density function may be generated for data centers located in tropical climates using their normalized annual consumption intensities. A comparison may be made between such a probability density function and the statistic for the building under study. For example, the building's statistic may be compared to the probability distribution function to determine the difference in standard deviations between the mean and the building statistic.

The analysis of the building statistics may include detecting an outlier. In some embodiments, the difference between the statistic for the building under study and those of the buildings in the class may be compared to a threshold value. For example, if the difference between the statistic for the building and the mean for the buildings in the class is greater than a threshold value, the building's statistic may be identified as being an outlier. Other techniques to identify a statistical outlier may also be used. In various embodiments, a geometric approach may be used (e.g., the distance between a statistic and its k-nearest neighbors may be evaluated to detect an outlier) or other statistical approaches may be used (e.g., Peirce's criterion, the GESD method, Chauvenet's criterion, etc.).

Process 300 further includes generating a report based on the analyzed statistics (step 310). The generated report may include data regarding a comparison of the statistic for a building and the statistics for one or more other buildings in its class. For example, a generated report may include a graph of a probability distribution function of a statistic for a class of buildings (e.g., hotels located in temperate climates) and an indication of how the statistic for a particular building compares to the class. The generated report may also include data regarding any detected outlier statistics. For example, the report may include only an indication that a building's statistic is an outlier compared to its class or may include diagnostic information regarding possible causes of the statistic.

Figure 4A:
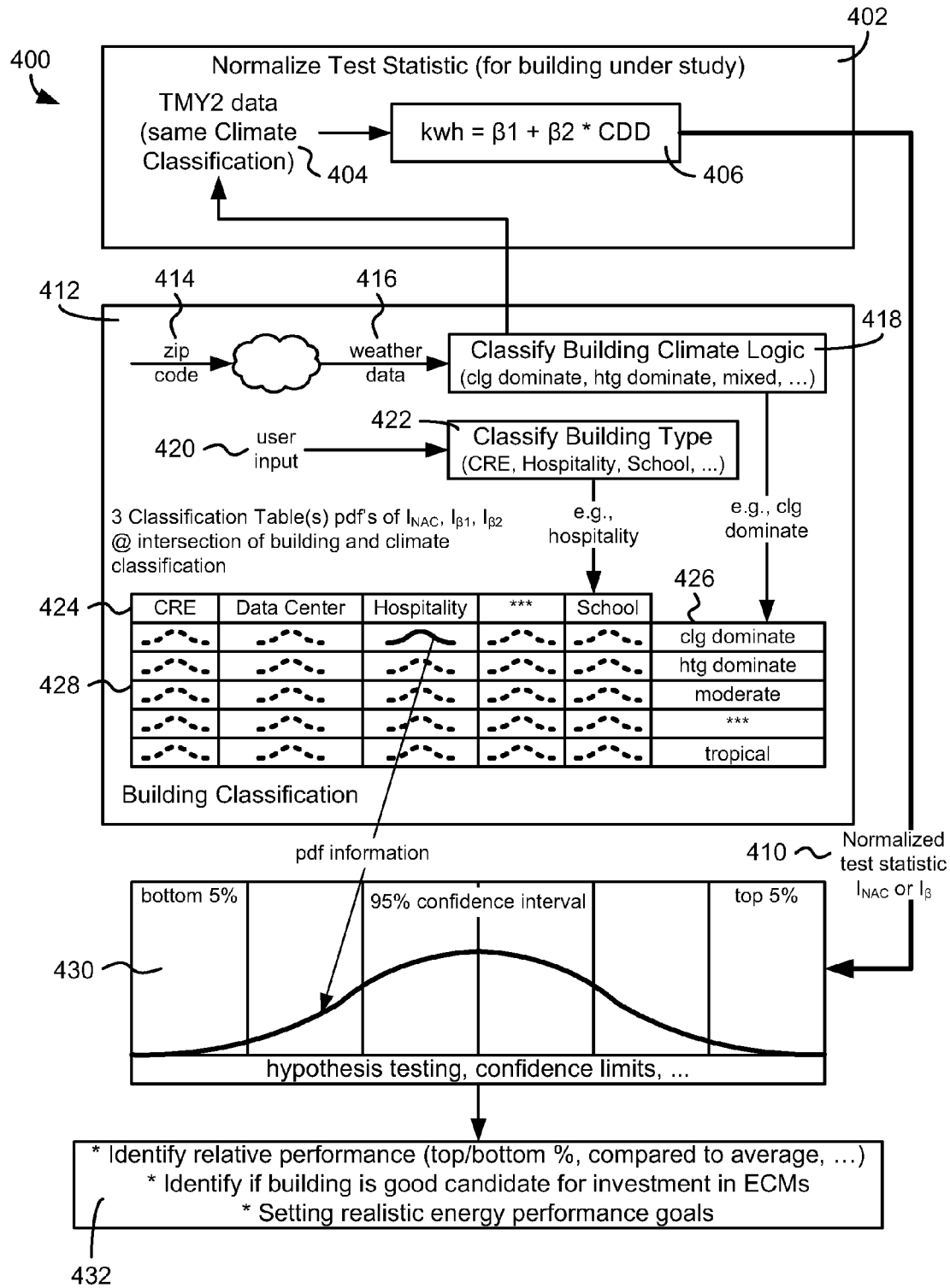
FIG. 4A is an illustration of an energy-related building statistic being compared with the statistics of other buildings, according to one embodiment.

Referring now to FIG. 4A, an illustration 400 of an energy-related building statistic being compared with the statistics of other buildings is shown, according to one embodiment. In the example shown, a building may be classified (block 412), its normalized energy use intensity modeled (block 402), and a statistic related to the building's energy use may be compared to those of other buildings having the same classification (block 432). In some embodiments, univariate statistical analysis may be used to evaluate the statistic for the building under study and the statistics for the other buildings having the same classification.

Buildings may be classified using any number of characteristics (by their usage type, climate, age, installed equipment, etc.), according to one embodiment. For example, buildings may be classified by their respective climates (block 418). In some cases, a building's climate may be determined based on the building's geographic location. For example, a building's zip code 414 may be used to determine the climate classification and to retrieve the TMY data for that climate as needed to drive the model 406. Other exemplary geographic inputs include a building's city, area code, or coordinates.

Based on weather data 416, the building's climate may be determined and used to associate the building with one of climate classifications 426. In general, a building's climate affects the operational mode and control logic for the building's HVAC system. For example, a building located in a hot climate may have an HVAC system that primarily operates in a cooling dominate manner. The cooling or heating requirements of the building may also affect the building's energy use (e.g., a building requiring more heating may use more energy). In some cases, the cooling or heating requirements of a building may be quantified using an HDD or CDD value, which may be included in weather data 416 or derived at block 418. Exemplary climate classifications may include, but are not limited to, cooling dominate climates, heating dominate climates, mixed climates (e.g., climates that require both heating and cooling at different times of the day, month, or year), moderate climates (e.g., climates in which building may not require much heating or cooling), tropical climates, and the like.

A building may also be classified by its usage type (block 422). Input data 420 from a user (e.g., data received via a user interface device) may be used to associate the building with one of usage type classifications 424. In some cases, input data 420 may simply include a selection of one of usage type classifications 424. In other cases, input data 420 may include answers to questions regarding the building. For example, a survey may be provided to an electronic display that includes questions regarding the building (e.g., they types of businesses that are located in the building, the type of equipment in the building, etc.). Based on the received answers to the questions, a matching usage type in usage type classifications 424 may be selected and associated with the building. Exemplary usage type classifications 424 include CRE buildings, data centers, hospitality centers, schools, etc.

The energy use of a building under study may be modeled and analyzed using the building's characteristics. For example, the billing data, actual weather data, and area data for the building may be used to generate an energy use model for the building. Billing data may include data indicative of energy consumption (e.g., measured in kWh), energy demand, water consumption, or one or more associated costs. In some cases, the billing data may be divided by the building's area in the building's energy use model. For example, the dependent variable in the energy use model may correspond to one or more measured energy consumptions per square foot of the building.

Energy use models may be generated for the other buildings in the same class as the building under study, in a similar manner as the building under study. For example, billing data and actual weather data for the buildings may be used within regression models to model the buildings' energy consumptions. The resulting $\beta_i$ parameters from these models may be used, in some embodiments, to compare the buildings. For example, an intensity value for a $\beta_i$ parameter for a building may be used as a compared value 410 to compare the building's statistic to other buildings in its class.

Normalized statistics for the building under study may also be determined (block 402) and compared between buildings in a class. For example, TMY2 data 404 may be selected based on the building's classification (e.g., the building's location may be used to determine the corresponding TMY2 data). In such a case, the TMY2 data 404 may be used to drive energy use model 406, to determine an NAC value for the building. For example, a normalized annual consumption intensity ($I_{NAC}$) value may be determined from the modeled independent variable of energy use model 406. Other statistics may also be normalized for the building under study across all buildings in its class. For example, the building's calculated thermal efficiency ($\eta$), thermal conductance area product (UA), temperature set point ($T_{setpt}$), outdoor air flow ($Flow_{OA}$), or any other statistic may be normalized and compared to those of other buildings in its class.

Similar to the building under study, normalized statistics also may be derived from the energy use models for each building belonging to a particular class. For example, normalized intensity values (e.g., $I_{NAC}$, $I_{\beta 1}$, $I_{\beta 2}$, etc.) may be determined using the respective buildings' energy use models. In the example shown, the resulting statistics for a class of buildings may be used to generate probability distribution functions 428 for each of the statistics. Probability distribution functions 428 may include, for example, a probability distribution function for the normalized annual consumption intensities of the hospitality buildings located in cooling dominate climates. Various metrics associated with probability distribution functions 428 may also be calculated, such as a distribution's mean, median, mode, or standard deviation.

In one embodiment, further statistical analysis may be used to evaluate probability distribution functions 428. The underlying data may include population data or sampled data from a population. Population data may come from situations where a customer has data from all similar buildings in a portfolio (e.g. bank branch offices). Sample data may come from situations where it is either impractical or impossible to get data for all members of a population (e.g. commercial office buildings in a moderate climate). For population data from a near normal distribution; the calculated population mean ($\mu$) and standard deviation ($\sigma$) can be used to calculate $100(1-\alpha)$ % confidence intervals for the statistic X as follows:

$$\mu - z_{\alpha/2} \cdot \sigma < X < \mu + z_{\alpha/2} \cdot \sigma$$

In another embodiment, less than the full population may be used by finding the values such that a fraction of $\alpha/2$ is less than the threshold and a fraction of $\alpha/2$ is greater than the threshold. For near normal sample data, point and interval estimates can be used to infer information about the population statistics. Point estimates use sample data to derive a single number that is the most plausible value of a population statistic. For example, point estimates for the population mean and standard deviation obtained from the sample mean $\overline{X}$ and standard deviation S are:

$$\hat{\mu} = \overline{X} \text{ and } \hat{\sigma} = S$$

The sampling distributions of $\overline{X}$ and S can be used to understand the margin of error in the point estimates. A $100(1-\alpha)$% confidence interval on the population mean $\mu$ can be calculated from the sampling distribution of the sample mean:

$$\overline{X} - t_{\alpha/2, n-1} \cdot \frac{S}{\sqrt{n}} < \mu < \overline{X} + t_{\alpha/2, n-1} \cdot \frac{S}{\sqrt{n}}$$

Where n equals the number data points in the sample. Likewise a $100(1-\alpha)$ % confidence interval on the population variance ($\sigma^2$) can be calculated from the sampling distribution of the sample variance $S^2$ as follows:

$$\frac{(n-1)S^2}{\chi^2_{\alpha/2, n-1}} < \sigma^2 < \frac{(n-1)S^2}{\chi^2_{1-\alpha/2, n-1}}$$

Where $\chi^2$ is a chi squared distribution.

In some embodiments, hypothesis testing may be performed to make a statement about population parameters from sample data for buildings in a particular class. Generally, a hypothesis test may test the validity of a hypothesis regarding a set of data. For example, a hypothesis test may be used to evaluate how well a regression model fits the energy use data for the buildings. In some cases, a null hypothesis test may be used which attempt to prove that a hypothesis is wrong given a set of data. Exemplary hypothesis tests may include, but are not limited to, F-tests, t-tests, and chi-squared tests. In one example, a hypothesis test may be used to test the hypothesis that a building statistic (x) comes from the distribution of the same building statistic for a given classification. In such a case we reject the null hypothesis and declare the building's statistic an outlier if either of the following holds true:

$$tinv\left(\frac{(1-\alpha)}{2}, n-1\right) < t$$

or $$t < tinv\left(\frac{\alpha}{2}, n-1\right)$$

where t is the test statistic (t=x/s). A null hypothesis ($H_0$) may be tested against an alternate hypothesis ($H_a$). Hypothesis testing generally results in one of two outcomes: rejection of the null hypothesis or failure to reject the null hypothesis. Since failure to reject the null hypothesis does not mean that the null hypothesis is true, the null hypothesis should be selected such that rejection of the null hypothesis is meaningful. For example, assume that the null hypothesis is that the financial savings that result from implementing an ECM is greater than or equal to a predicted savings and that the alternate hypothesis is that the savings is less than the predicted amount. If the null hypothesis in this case is rejected, the savings are not greater than or equal to the predicted amount.

One of normalized statistics 410 may be compared to the corresponding statistics from the other buildings in its class (block 430). For example, the normalized annual consumption intensity ($I_{NAC}$) of the building under study may be compared to those of other buildings in its class. The comparison in block 430 may include comparing the statistic to a probability distribution function for the class' statistics. For example, the comparison may include determining how many standard deviations the building's statistic is above or below the mean of the probability distribution function for the other buildings in the same class. The comparison may also include determining whether the statistic for the building under study is above or below a threshold value relative to the probability distribution function. For example, a statistic that is above or below a threshold number of standard deviations above or below the mean may be identified as requiring further attention. In some embodiments, outliers may be detected (e.g., using the GESD method, hypothesis testing, Wilks' method, cluster analysis, etc.). For example, the GESD or Wilks' method may be performed iteratively to remove outliers before comparing buildings' statistics.

Various reports may be generated based on the comparison between the statistics for the building under study and those in the probability distribution function (block 432). In one embodiment, a generated report may identify the building's relative performance based on the comparison (e.g., by identifying the building as being in the top or bottom x %, identifying the difference between the statistic and the median, etc.). In another embodiment, a generated report may identify whether the building under study is a good candidate for ECMs. For example, a report may identify a building as being a good candidate if the building's normalized annual consumption intensity is above a certain threshold value above the mean of the probability distribution for its class. Similarly, a generated report may indicate that an equipment fault may exist in the building. For example, a building in which ECMs were implemented and has a higher than average statistic may be flagged for further diagnosis. A generated report may also be used to set realistic performance goals for ECMs, based on the performance of other buildings in its class in which the ECMs were implemented.

Referring now to FIGS. 4B-4E, a more detailed example of an energy-related building statistic being compared with the statistics of other buildings is shown, according to an exemplary embodiment. FIGS. 4B-4E generally illustrate the use of lean energy analysis to compare buildings having the same classification. Based on readily available data, such as billing data, weather data for the buildings' locations, etc., energy use models for the buildings may be determined and used to compare buildings within a given classification.

Figure 4B:
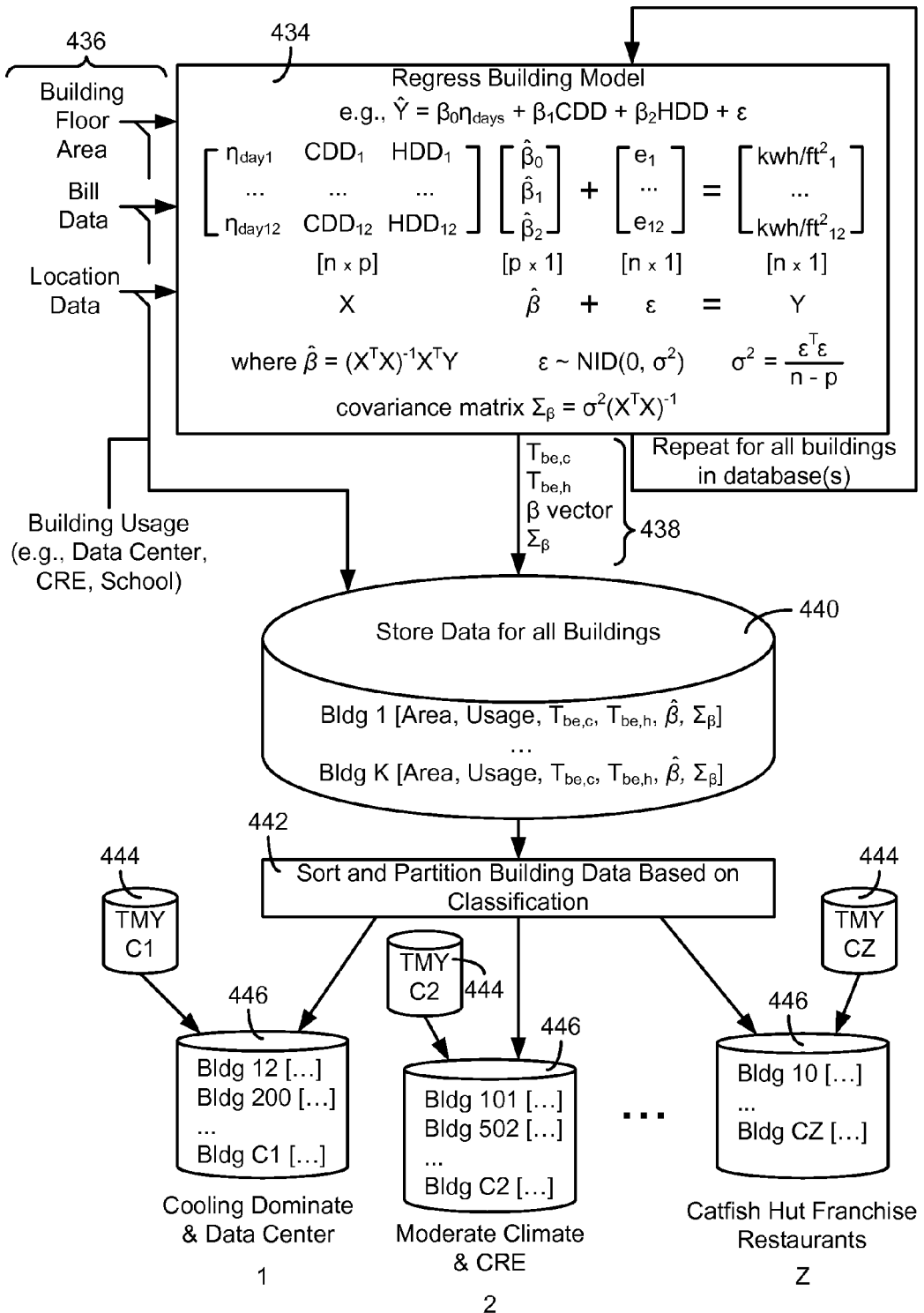
FIGS. 4B-4E illustrate an energy-related building statistic being compared with the statistics of other buildings in more detail, according to an exemplary embodiment.

In FIG. 4B, data 436 may be received regarding a plurality of buildings. In one embodiment, data 436 may include data regarding the floor area of a building, billing data for the building (e.g., data from an electric utility, from a water utility, etc., regarding the building's consumption of a resource, a cost of the consumption, etc.), location data for the building, or data regarding the building's usage type (e.g., whether the building is a data center, CRE, school, etc.). Data 436 may be obtained from readily available sources in accordance with lean energy analysis, allowing the energy use of the respective buildings to be modeled using minimal data (e.g., without incurring the financial cost of conducting an expensive energy audit).

In block 434, a regression model may be generated for each building using the building's corresponding data in data 436 (i.e., block 434 may be repeated for some or all of the buildings for which data 436 is known). For example, each building may be modeled as follows:

$$E = \beta_0(\#days) + \beta_1(CDD) + \beta_2(HDD) + \epsilon$$

where E is the dependent variable representing the building's energy use, CDD is a cooling degree day value for the building, HDD is a heating degree day value for the building, $\epsilon$ is an error factor, and $\beta_0$-$\beta_2$ are coefficients for the model. Values for the dependent variables in the regression may be obtained over any number of different time periods and used to form a matrix of independent variables. For example, an n×p matrix X may be formed using the independent variables for the building (e.g., #days, CDD, HDD values, person days, etc.). Values in matrix X may correspond to values calculated over a sliding time frame throughout the course of the year (e.g., the first row of matrix X may contain values obtained using data from September 2012-September 2013, the second row of matrix X may contain values obtained using data from October 2012-October 2013, etc.). A p×1 vector $\hat{\beta}$ (e.g., containing $\beta_0$, $\beta_1$, $\beta_2$, etc.) and an n×1 vector $\epsilon$ (e.g., containing $\epsilon$ values) may likewise be formed. Finally, the independent variables representing n number of normalized energy consumptions (e.g., energy consumption values divided by the building's floor area) may be used to form an n×1 vector Y. In other words, the regression model may be represented in the form:

$$X\hat{\beta} + r = \hat{Y}$$

where X is a matrix containing the independent variables, $\hat{\beta}$ is a vector containing the model coefficients, r is the vector containing the residuals, and $\hat{Y}$ is a vector of estimated energy consumption values normalized by building floor area. The estimated variance of the model error is given by:

$$\hat{\sigma}^2 = \frac{r^T r}{n - p}$$

and a covariance matrix $\hat{\Sigma}_\beta$ equal to:

$$\hat{\Sigma}_\beta = \hat{\sigma}^2 (X^T X)^{-1}$$

In various embodiments, any number of different regression techniques (e.g., OLSR, WLSR, etc.) may be used to solve for the vector $\hat{\beta}$ containing the regression model coefficients. For example, a least squares regression has the following solution for the model coefficients:

$$\hat{\beta} = (X^T X)^{-1} X^T Y$$

where $X^T$ is the transpose of the matrix X.

At block 440, the variables 438 for each building obtained from their respective regression models may be stored in an electronic memory. For example, a building's cooling break even temperature ($T_{be,c}$), heating break even temperature ($T_{be,h}$), model coefficients (e.g., the coefficient values in vector $\hat{\beta}$), and the covariance matrix $\Sigma_\beta$ may be stored for each building. Data 436 may also be stored in the memory for each building. For example, a building's floor area, billing data, location data, or usage type may be stored in the memory with the values from the building's regression model.

At block 442, the data stored for each building in block 440 may be sorted and partitioned based on the buildings' classifications. For example, the buildings may be classified and grouped based on their location, usage type, or any other characteristic. Any number of different groups of buildings may result depending on the type of classification used (e.g., a first through $z^{th}$ group of buildings). As shown, building groups 446 may include a first group of data centers located in a cooling dominate climate, a second group of CRE located in a moderate climate, and a group of franchise restaurants (e.g., "Catfish Hut" restaurants). A set of TMY data 444 may also be associated with each of building groups 446. For example, TMY data for a cooling dominate climate may be associated with the first group of buildings, TMY data for a moderate climate may be associated with the second group of buildings, etc.

Figure 4C:
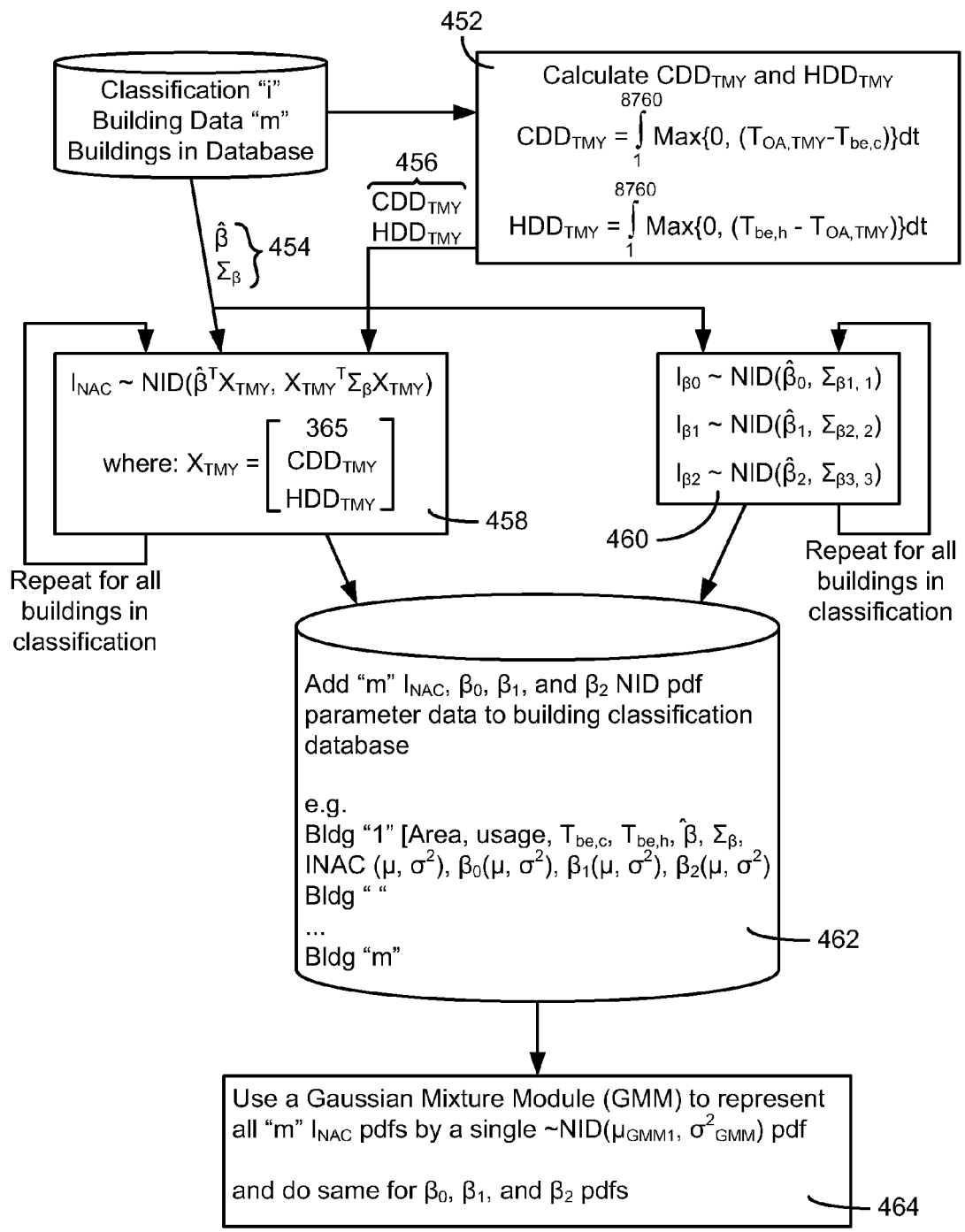

Continuing the example of lean energy analysis in FIG. 4C, normalized intensity values may be determined for each of building groups 446 (e.g., for each building having a particular classification). The corresponding TMY data 444 for the building groups 446 may be used to drive the buildings' energy use models, to determine the normalized intensity values for the buildings. In general, these calculations allow for the buildings' energy consumptions to take into account the typical changes in the weather throughout the year.

In block 452, TMY data 444 may be used for each building in a particular class to determine CDD and HDD values 456 for the buildings. For example, a $CDD_{TMY}$ value may be determined as follows:

$$CDD_{TMY} = \int_0^{8760} \text{Max}\{0, T_{OA,TMY} - T_{be,c}\} dt$$

where $T_{OA,TMY}$ is the outdoor air temperature indicated by TMY data 444, $T_{be,c}$ is the cooling break even temperature for the building and 8760 represents the time period over which the CDD value is calculated (e.g., 24 hours*365 days=8760 hours). Similarly, an $HDD_{TMY}$ value may be determined as follows:

$$HDD_{TMY} = \int_0^{8760} \text{Max}\{0, T_{be,h} - T_{OA,TMY}\} dt$$

where $T_{be,h}$ is the heating break even temperature for the building, $T_{OA,TMY}$ is the outdoor air temperature indicated by TMY data 444, $T_{be,h}$ is the heating break even temperature for the building and 8760 represents the time period over which the CDD value is calculated (e.g., 24 hours*365 days=8760 hours).

For each building having a particular classification, the building's values 456 may be used with its stored values 454 (e.g., vector $\hat{\beta}$ and covariance matrix $\Sigma_\beta$) to determine the intensity values for the building. In block 458, a normalized annual consumption intensity value ($I_{NAC}$) may be determined for a building using the CDD and HDD values 456. For example, the NAC values in vector Y may be divided by the typical production values that result by driving the energy use model with the TMY-derived values 456. Intensity values for the model coefficients in vector $\hat{\beta}$ may be determined in block 460 in a similar manner. The $I_{NAC}$ and $I_\beta$ values obtained for each building form probability density functions. All data obtained for a building via blocks 452, 458, and 460 then may be stored in the electronic memory, as shown in block 462 (e.g., the memory may store the obtained data for m-number of buildings having a particular classification).

In block 464, a Gaussian mixture model (GMM) may be used to represent all $I_{NAC}$ probability density functions for the buildings in a particular classification as a single probability density function. A GMM may also be used for each of the model coefficient intensities (e.g., $I_{\beta 0}$, $I_{\beta 1}$, $I_{\beta 2}$, etc.) to generate corresponding probability density functions to represent the buildings in the class. For example, the $I_{NAC}$ probability density functions for data centers located in a cooling dominate may be combined in block 464 to form a single probability density function to represent the entire class.

Figure 4D:
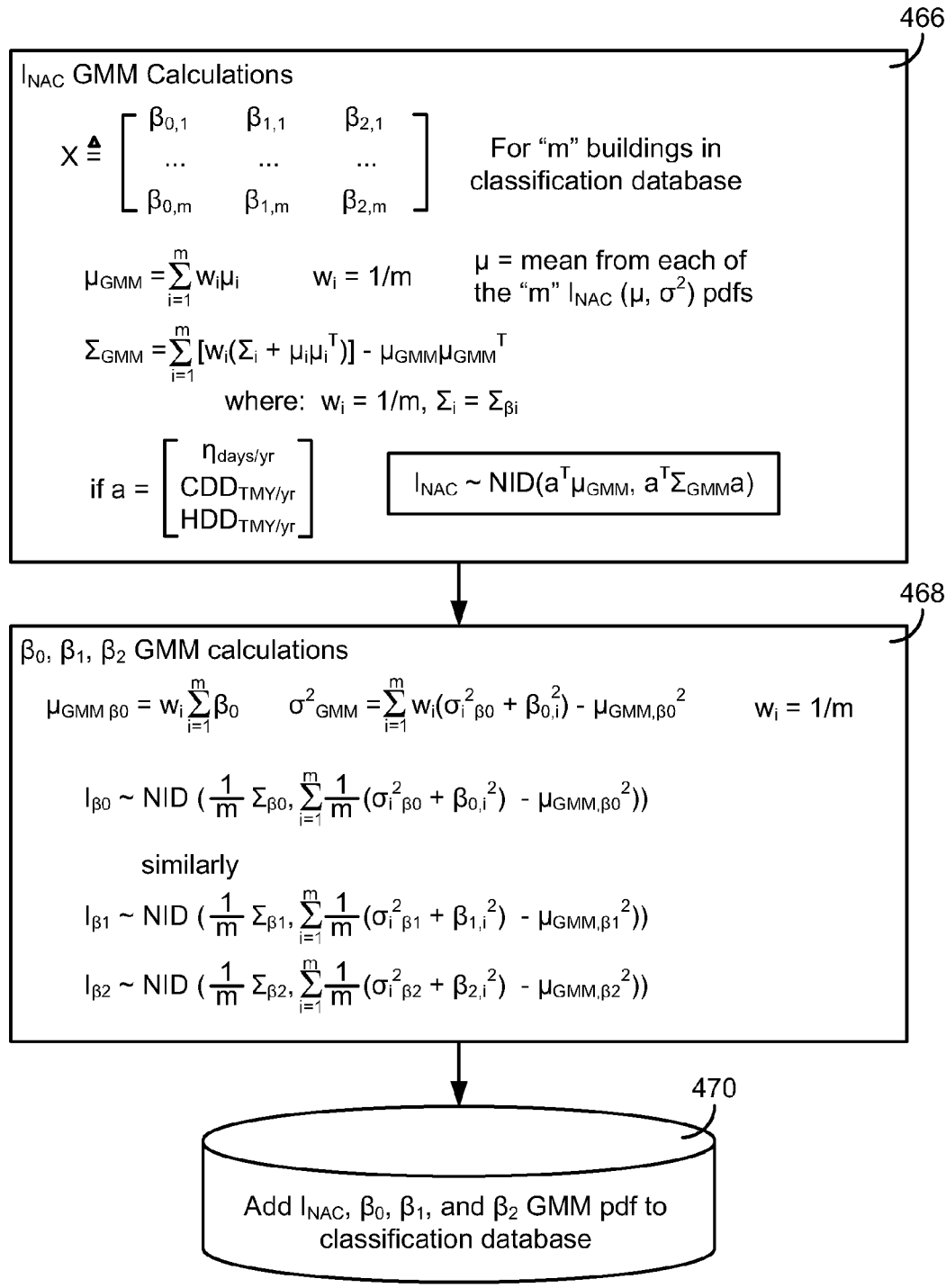

FIG. 4D shows the GMM calculations of block 464 in more detail. In block 466, the m-number of $I_{NAC}$ probability density functions for the buildings in a class may be combined into a single $I_{NAC}$ probability density function using a GMM. First, a mean of the individual probability density functions may be calculated as follows:

$$\mu_{GMM} = \sum_{i=1}^{m} w_i \mu_i$$

where $\mu_i$ is the mean of the $I_{NAC}$ probability density function for the ith building in the class and $w_i$ is equal to 1/m or the ratio of building i's area/total area, depending on the desired weighting. A covariance matrix may also be determined as follows:

$$\Sigma_{GMM} = \sum_{i=1}^{m} [w_i(\Sigma_i + \mu_i \mu_i^T)] - \mu_{GMM} \mu_{GMM}^T$$

where $w_i$ is equal to 1/m and $\Sigma_i$ is the covariance matrix for the $\beta_i$ coefficients for the ith building in the class (e.g., $\Sigma_{\beta,i}$). The resulting probability distribution function may then be determined such that the $I_{NAC}$ for the buildings in the class are normally and independently distributed as follows:

$$I_{NAC} \sim NID(a^T \mu_{GMM}, a^T \Sigma_{GMM} a)$$

where a is a vector of the independent variables (e.g., # days, $CDD_{TMY}$, $HDD_{TMY}$, etc.) used to determine the normalized annual consumption intensity values.

In block 468, each of probability density functions for the model coefficients (e.g., the $\beta_i$ values) for the buildings in a class may be combined using GMMs to form combined probability density functions. Where a multivariate approach may be used in block 466, a scalar approach may instead be used in block 468 for each of the model coefficients. For example, the probability density functions for the model coefficient $\beta_0$ may be determined by first calculating a mean of the $\beta_0$ for each of the buildings in the class as follows:

$$\mu_{GMM,\beta 0} = w_i \sum_{i=1}^{m} \beta_0$$

where $\beta_0$ is the model coefficient for the ith building in the class. A variance may also be determined as follows:

$$\sigma_{GMM}^2 = \sum_{i=1}^{m} w_i(\sigma_{i,\beta 0}^2 + \beta_{0,i}^2) - \mu_{GMM,\beta 0}^2$$

where $w_i$ is equal to 1/m (or the ratio of building i's area to the total area, depending on the desired weighting) and $\sigma_{i,\beta 0}^2$ is the variance of the $\beta_0$ coefficients for the ith building in the class. This results in a distribution of $I_{\beta 0}$ values as follows:

$$I_{\beta 0} \sim NID\left(w_i \Sigma_{\beta 0}, \sum_{i=1}^{m} w_i(\sigma_{i,\beta 0}^2 + \beta_{0,i}^2) - \mu_{GMM,\beta 0}^2\right)$$

where $\Sigma_\beta$ is the covariance matrix of the model parameters. Probability density functions may also be generated in a similar way for the remaining model coefficients (e.g., $\beta_1$, $\beta_2$, etc.) across the class of buildings.

In block 470, the probability density functions from the GMMs used in blocks 466, 468 may be stored in the electronic memory. Each set of probability density functions may be associated with its corresponding group of buildings in groups 446. For example, a probability density function may be determined for the $I_{NAC}$ values of schools located in temperate climates and stored in the memory.

Figure 4E:
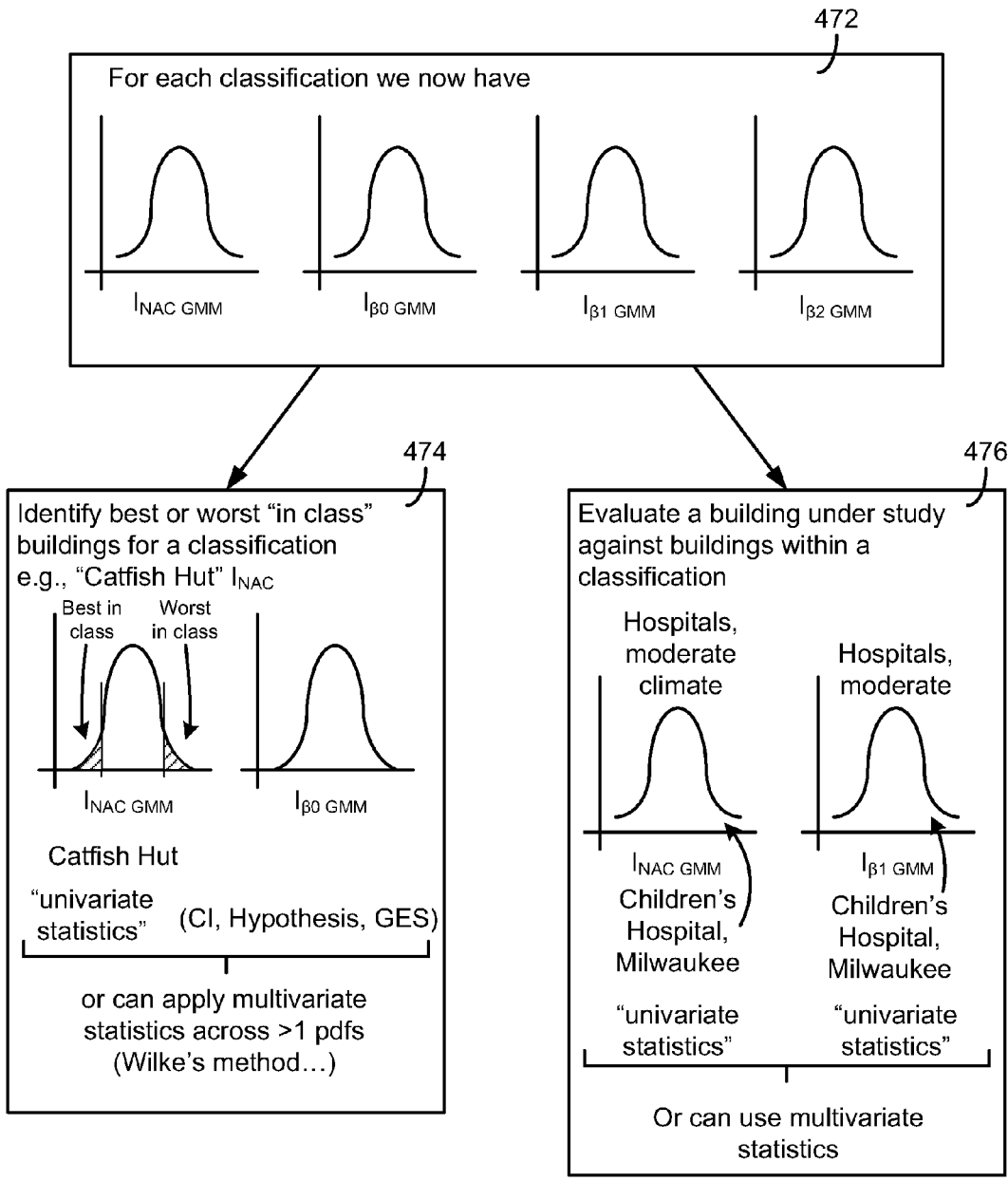

FIG. 4E shows the stored probability density functions for a classification being used to assess the performance of a building. Block 472 illustrates the probability density functions for the intensity values of the buildings in the class (e.g., the probability density functions determined in blocks 466, 468 and stored in memory in block 470). For example, assume that one of the groups of buildings includes data centers located in temperate climates. In such a case, probability density functions may exist from the GMMs for intensity values $I_{NAC}$, $I_{\beta 0}$, $I_{\beta 1}$, and $I_{\beta 2}$. Using these functions, any number of different comparisons may be made among buildings in the class. In one example shown in block 474, best or worst in class buildings may be identified. In another example shown in block 476, a building under study may be compared to other buildings in its class.

Various techniques may be used to compare the buildings having a particular classification. For example, assume that one class of buildings includes buildings owned by the Catfish Hut franchise. In some embodiments, univariate analysis may be used to analyze the values in one of the probability density functions (e.g., the function for $I_{NAC}$, $I_{\beta 0}$, $I_{\beta 1}$, or $I_{\beta 2}$). For example, confidence intervals, hypothesis testing, or the GESD method may be used on the $I_{NAC}$ probability density function to identify best or worst in class buildings. In other embodiments, two or more of the building statistics can be analyzed together using multivariate statistics (e.g., by determining a Mahalanobis distance, etc.).

In block 476, one or more of the probability density functions for the buildings in a class may be used to analyze a particular building under study. The building under study may have already been modeled and used to determine the probability density function for the class, or may have been recently modeled. For example, the energy consumption of Children's Hospital in Milwaukee, Wis. may be modeled and its intensity values compared to one or more of the probability density functions for the other buildings in its class. In some embodiments, univariate statistical analysis may be used to compare the building under study to one of the probability density functions. For example, the $I_{NAC}$ values for Children's Hospital may be compared to the $I_{NAC}$ probability density function for other hospitals located in a moderate climate. In other embodiments, multivariate analysis may be used to compare two or more intensity values for the building under study to corresponding multivariate probability density functions for the buildings in its class. For example, the joint $I_{NAC}$ and $I_{\beta 0}$ for the building under study may be compared with the $I_{NAC}$ and $I_{\beta 0}$ probability density functions for the buildings in its class using multivariate analysis (e.g., by determining a Mahalanobis distance, etc.).

Multivariate Analysis of Building Statistics

In various embodiments, multiple statistics derived from a building's energy use model may be compared to those of other buildings having the same classification. Similar to univariate analysis of a building's statistic, the comparison between statistics for a building under study and other buildings in its class may be used to detect abnormal energy consumption, identify potential candidates for ECMs, and set realistic expectations by implementing ECMs in the building. However, multivariate analysis allows different types of statistics to be analyzed at the same time. In other words, the different types of statistics for a building may be treated as a multivariate vector and compared to the vectors for the other buildings having the same classification.

Figure 5:
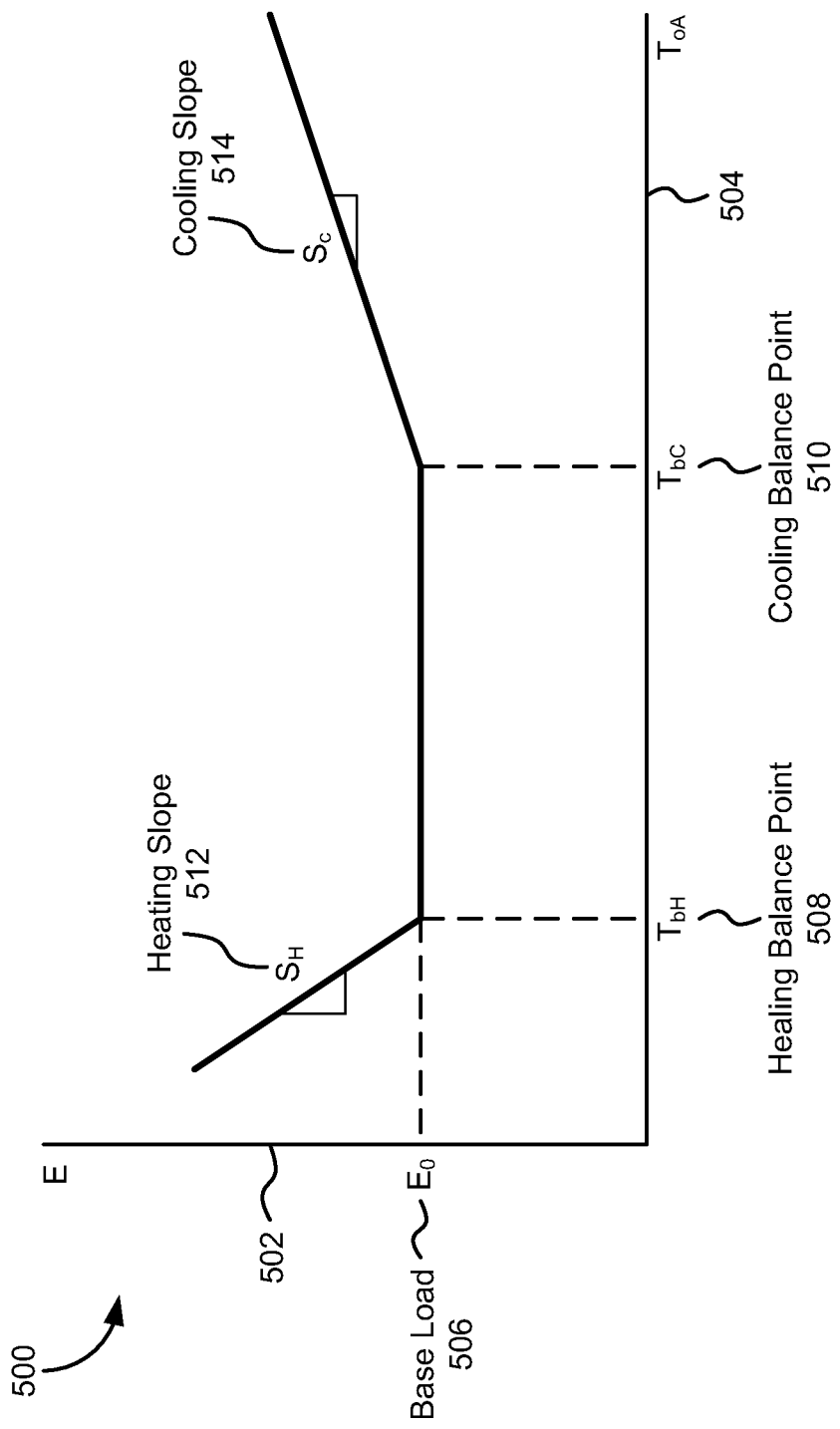
FIG. 5 is an illustration of building model parameters, according to one embodiment.

Referring now to FIG. 5, an illustration 500 of building model parameters is shown, according to one embodiment. In general, a number of different factors may affect the energy use of a building. For example, the outdoor air temperature of the building may affect the building's energy use (e.g., to heat or cool the building to a set point temperature). The building's energy use profile when cooling the building may also differ from the building's energy use profile when heating the building. In some embodiments, the building's energy use model may include parameters relating to both heating and cooling the building.

As shown in illustration 500, an x-y plot may be formed with a building's energy use (E) plotted along a first axis 502 and the outdoor air temperature ($T_{OA}$) plotted along a second axis 504. In various embodiments, the building's energy use plotted along axis 502 may be an energy consumption (e.g., measured in kWh) or an energy cost associated with the building's energy consumption (e.g., by multiplying the consumption by a cost per consumption value in \$/kWh). Such information may be obtained, for example, from billing data for the building from the utility providing the energy to the building. In one embodiment, the outdoor air temperature may be measured for a building using sensors located at or near the building over a particular time period.

A first parameter that may be used to model a building's energy use is its base energy load ($E_O$) 506. In general, base energy load 506 corresponds to the energy use of the building at any given time that does not change with the outdoor air temperature. For example, base energy load 506 may be a function of the energy use of the building's lighting, computer systems, security systems, and other such electronic devices in the building. Since the energy consumption of these devices does not change as a function of the outdoor air temperature, base energy load 506 may be used to represent the portion of the building's energy use that is not a function of the outdoor air temperature.

In some embodiments, HDD and CDD values for a building may be calculated by integrating the difference between the outdoor air temperature of the building and a given temperature over a period of time. In one embodiment, the given temperature may be cooling balance point 510 for the building (e.g., to determine a CDD value) or heating balance point 508 for the building (e.g., to determine an HDD value). For example, assume that the cooling balance point for a building is 67° F. In such a case, the CDD value for the building over the course of a month may be calculated as follows:

$$CDD = \int^{month} \text{Max}\{0, (T_{OA} - 67° \text{ F.})\} dt$$

In other embodiments, a set reference temperature may be used to calculate a building's CDD or HDD value instead of the building's actual balance point. For example, a reference temperature of 65° F. may be used as a fixed value to compare with the building's outdoor air temperature. Thus, a CDD or HDD value may generally represent the amount of heating or cooling needed by the building over the time period.

A heating slope ($S_H$) 512 may correspond to the change in energy use or energy costs that result when the outdoor air temperature drops below a heating balance point 508 (e.g., a breakeven temperature). For example, assume that heating balance point 508 for a building is 55° F. When the outdoor air temperature is at or above 55° F., only an energy expenditure equal to base load 506 may be needed to maintain the internal temperature of the building. However, additional energy may be needed, if the outdoor air temperature drops below 55° F. (e.g., to provide mechanical heating to the interior of the building). As the outdoor air temperature decreases, the amount of energy needed to heat the building likewise increases at a rate corresponding to heating slope 512.

Similar to heating balance point 508, a cooling balance point ($T_{bC}$) 510 may correspond to the outdoor air temperature at which additional energy beyond base energy load 506 is needed (e.g., the energy needed to provided mechanical cooling to the interior of the building). As the outdoor air temperature rises beyond cooling balance point 510, the amount of energy needed for cooling with also increase at a rate corresponding to cooling slope ($S_C$) 514.

One potential energy use model that takes into account the various model parameters illustrated in illustration 500 is as follows:

$$E = \beta_0(\#days) + \beta_1(CDD) + \beta_2(HDD) + \epsilon$$

where E is the dependent variable representing the energy use or cost plotted along axis 502 in illustration 500. $\beta_0$ may be a base energy use, such as base energy load 506. $\beta_1$ may correspond to cooling slope 514 that, when multiplied by the CDD for a particular time, results in an energy use or cost attributable to cooling the building. Similarly, $\beta_2$ may correspond to heating slope 512 that, when multiplied by the HDD for a particular time, results in an energy use or cost attributable to heating the building. The value of $\epsilon$ may correspond to the amount of error or noise in the model. In some embodiments, the model may instead model the energy-related costs for the building by multiplying the building's energy use by a conversion factor (e.g., by multiplying by a cost factor measured in $/kWh). In further embodiments, the model may be normalized by dividing the model by the internal area of the building. For example, the model may model the normalized energy use (e.g., measured in kWh/ft$^2$) or normalized energy cost (e.g., measured in $/ft$^2$).

According to various embodiments, the various parameters used in a building's energy use model may be represented as a multidimensional vector. For example, one vector may be defined as a five-dimensional vector as follows:

$$\phi_m = \begin{bmatrix} E_0 \\ S_H \\ S_C \\ T_{bH} \\ T_{bC} \end{bmatrix} \in R^5$$

In some embodiments, a building's vector of model parameters may be compared to those of other buildings having the same classification. For example, outlier values may be detected by using multivariate statistical analysis on the respective vectors.

Referring now to FIGS. 6A-6B, energy use model parameters plotted along their respective dimensions are shown, according to various embodiments. In FIG. 6A, a single dimensional plot 600 of buildings' cooling balance points ($T_{bC}$) along an axis 602 is shown. In some embodiments, a building's cooling balance point may be compared to those of other buildings having the same classification. For example, a cooling balance point 604 may be compared to a set of cooling balance points 606 for other buildings having the same classification (e.g., based on the buildings' climates, usage types, etc.).

In FIG. 6B, a single dimensional plot 610 is shown of buildings' cooling slopes ($S_C$) along an axis 612. Similar to plot 600, a cooling slope 614 for a building under study may be compared to cooling slopes 616 for other buildings having the same classification. In some cases, cooling slopes 614, 616 in plot 610 may have corresponding cooling balance points 604, 606 in plot 600. For example, cooling slope 614 and cooling balance point 604 may be energy use model parameters for the same building under study.

According to some embodiments, outliers may be detected among the energy use model parameters in plots 600, 610. However, the values of the buildings' parameters may be distributed such that clear-cut outliers may be difficult to detect via analysis in a single dimension (e.g., using univariate analysis). For example, cooling balance point 604 for the building under study may appear within the same cluster of values as cooling balance points 606 for the buildings having the same classification. Similarly, cooling slopes 614 for the building under study may appear within the same cluster of values as cooling slope 616 for the buildings having the same classification. In these and other cases, multivariate analysis may be used instead to detect outlier values among the buildings' energy use parameters or other values that may be derived from their energy use models.

Figure 7:
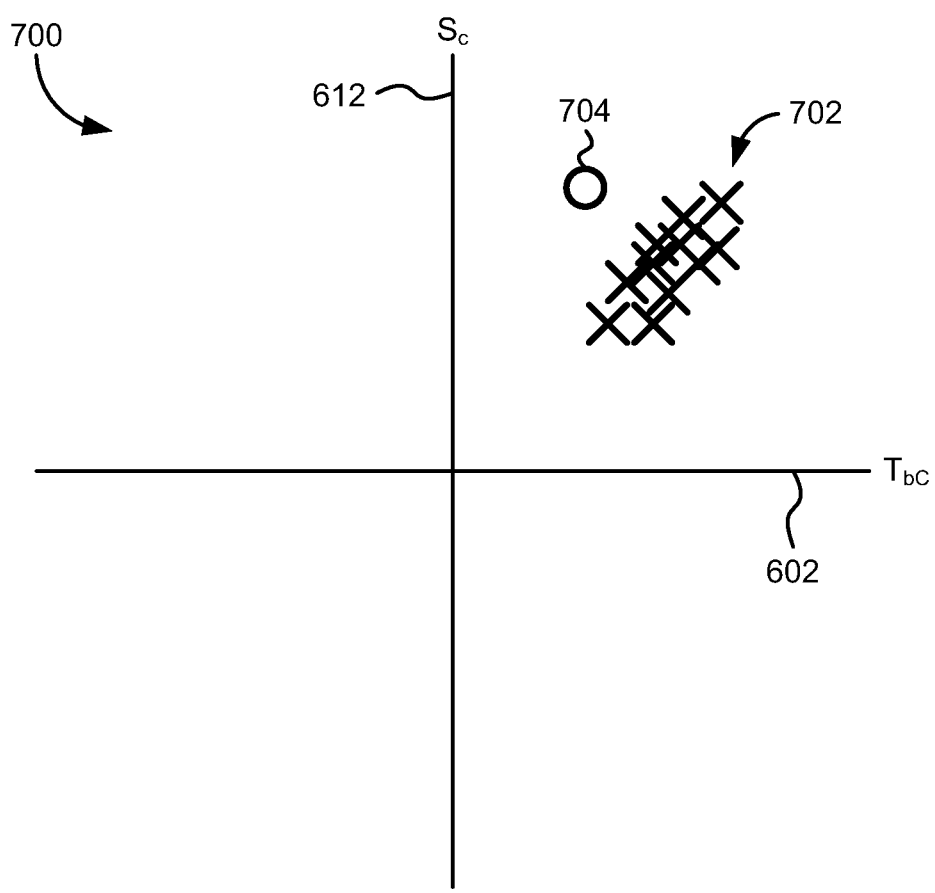
FIG. 7 is an illustration of a two-dimensional plot of the building model parameters of FIGS. 6A-6B, according to various embodiments.

Referring now to FIG. 7, a two-dimensional plot 700 of building model parameters is shown, according to one embodiment. In the example shown, plot 700 includes axis 602 from FIG. 6A and axis 612 shown in FIG. 6B, thereby defining a two-dimensional plane. Energy use model parameters for a building may be represented as two-dimensional sets of values of the form ($S_C$, $T_{bC}$). For example, a building under study may have a pair of values 704 that correspond to cooling balance point 604 and cooling slope 614 in FIGS. 6A-6B. Buildings having the same classification as the building under study may also have pairs of values 702, corresponding to cooling balance points 606 and cooling slopes 616 in FIGS. 6A-6B.

In some embodiments, multivariate analysis may be used to detect outliers among the buildings' energy use model parameters or among other values derived from their energy use models. Multivariate outliers may be more prominent than univariate outliers, in some cases. For example, as shown in FIGS. 6A-6B, the cooling balance point and cooling slope parameters for the building under study may appear within the cluster of values for the other buildings when analyzed in a single dimension. However, when these parameters are analyzed together, outliers may be more prominent that in a unidimensional vector space.

As shown by plot 700, the pair of values 704 for the building under study appears more prominently as an outlier from the pairs of values 702, than if each parameter is analyzed separately. Thus, multivariate analysis alternatively may be used to compare the building's energy use model parameters to those of one or more other buildings having the same classification. In addition, a building's parameters may be interrelated. For example, a cooling slope may be defined as follows:

$$S_C = \frac{cc}{\eta_c}$$

where cc is a cooling coefficient function of ventilation and $\eta_c$ represents the building's cooling efficiency. Similarly, a building's cooling balance point may be defined as follows:

$$T_{bC} = T_{sp} - \frac{Q_i}{cc}$$

where $T_{sp}$ is a temperature set point for the building, $Q_i$ is the internal load of the building, and cc is the cooling coefficient function of ventilation also used to define the building's cooling slope.

For the building under study in plot 700, its pair of values 704 may be analyzed to determine that the building has an abnormally high ventilation, leading to its higher than normal cooling balance point. Similarly, the building's increased cooling slope may also be attributable to an abnormally high ventilation. Thus, outlier parameters for a building's energy model may be analyzed to detect abnormal energy consumption, in some embodiments.

Figure 8:
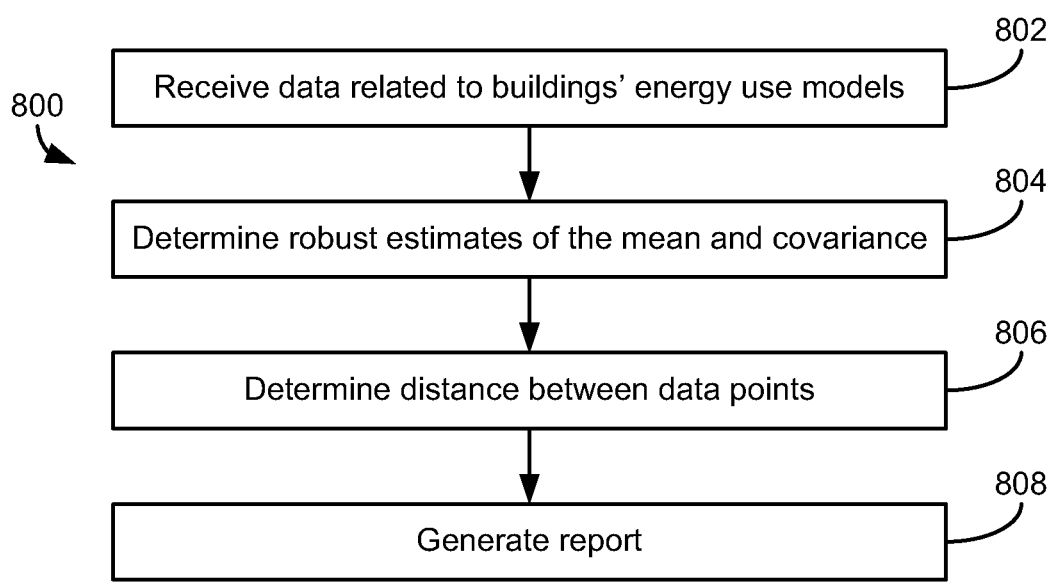
FIG. 8 is a flow chart of a process for comparing values related to a building's energy use model to those of other buildings, according to one embodiment.

Referring now to FIG. 8, a flow chart is shown of a process 800 for comparing values related to a building's energy use model to those of other buildings, according to one embodiment. Process 800 may be implemented by one or more computing devices, such as by a data acquisition and analysis service, a building's control system, or the like. In general, process 800 may use multivariate analysis to compare energy use model parameters or other data that may be derived from the parameters.

Process 800 includes receiving data related to buildings' energy use models (step 802). In some embodiments, the buildings may belong to the same class of buildings, based on their usage type, climate, or other factors. The data may be the actual parameters used in the buildings' energy use models. Energy use model parameters may include, but are not limited to, base energy load values, heating balance points, cooling balance points, heating slopes, and cooling slopes. Other values related to the energy use model parameters, but not actually used in the models, may also be received and analyzed via process 800. For example, a building's cooling balance point may be related to the building's temperature set point and cooling load. One or both of these values may also be compared among buildings, to detect outliers and perform other such functions.

The energy use model for a building may model the actual energy use of the building or a value associated with the building's energy use, such as an energy use cost. For example, an energy use model may model a building's energy consumption or a cost associated with the building's energy consumption. A conversion factor may be used to convert from one energy use metric to another. For example, an energy use model that models a building's energy consumption may be converted into a model that models the building's energy costs by multiplying by a cost per consumption value (e.g., a value measured in $/kWh). In some embodiments, the data may also be normalized across the set of buildings by dividing the parameters of the energy use models by their buildings' respective areas.

Process 800 includes determining the mean of the energy use model parameters (step 804). In some embodiments, the actual mean of the parameters may be used. In other embodiments, a robust estimator of the mean may be used. For example, the minimum covariance determinant method may be used to determine a robust estimate of the mean and covariance of a random sample of the received data. Such a method may be used to determine a robust estimate of the mean and covariance of the data, under the assumption that the data conforms to a multivariate normal distribution.

In one embodiment, he minimum covariance determinant method may be implemented as follows: first, randomly choose p+1 data, where p is the dimension of the data. The sample mean and covariance are then calculated as follows using h number of data points:

$$T_k = \frac{1}{p}\sum_i x_i \quad W_k = \frac{1}{p-1}\sum_i (x_i - T)(x_i - T)^T$$

where $T_k$ is the calculated mean for sample set, $x_i$ is the ith data point, and $W_k$ is the covariance. Next, the Mahalanobis distance ($d_i$) may be calculated for each data point ($x_i$) as follows:

$$d_i = (x_i - T_k)^T W_k^{-1} (x_i - T_k)$$

where $d_i$ is the Mahalanobis distance for each data point using the current values of $T_k$ and $W_k$. Next, $T_k$ and $W_k$ can be recalculated with the h number of data points having the smallest $d_i$. This may be repeated until the determinant of $W_k$ remains constant (e.g., $det(W_k)=c$, where c is a constant). Once the determinant of $W_k$ remains constant with the current set of h data points, these calculations may be repeated iteratively using randomly selected initial starting points to find values of $T_k$ and $W_k$ having the smallest determinants. $W_k$ may then be scaled for statistical consistency.

Process 800 includes determining the distance between data points (step 806). The distance between data points from different buildings may be measured, for example, using a Mahalanobis distance or a Euclidean distance between the data points. In some embodiments, a geometric centroid may be determined using the data points for the buildings and the distance calculated between each data point and the centroid. In cases in which the Mahalanobis distance is used, the robust estimates of the mean and covariance determined in step 804 may be used (i.e., the $T_k$ and $W_k$ having the smallest determinant and scaled for consistency). In general, a Mahalanobis distance can be thought of as a statistical distance away from the typical building. If a robust estimate of the mean and covariance is not used, the Mahalanobis distance for each building may follow a Hotelling's T-squared distribution. Otherwise, h-p degrees of freedom may be used, instead of n-p degrees of freedom, where n is the total number of data points and h is the sample size used to calculate the robust estimates of the mean and covariance. If h and n are close in value, n-p may instead by used in some embodiments, since the difference will not significantly affect the resulting distribution.

Process 800 includes generating a report using the calculated distances for the buildings' data points (step 808). A generated report may include a graph, table, or other indication of the calculated distance between one of the buildings and those of the other buildings. For example, a calculated distance for a building under study may be included in the generated report. A report may also include a plot of the distances, in one embodiment. For example, a plot of the distances calculated for each building may be included in a generated report. A report may include any number of bivariate plots in which two of a building's energy use model parameters or other variables are treated as data points in two dimensions, such as in FIG. 7. Where more than two values for a building are compared to those of other buildings, a report may include a maximum of n choose 2 number of plots, where n is the number of data values being analyzed for a building. For example, a first bivariate plot may plot cooling slopes vs. heating balance points and a second bivariate plot may plot heating balance points vs. base energy loads.

Figure 9:
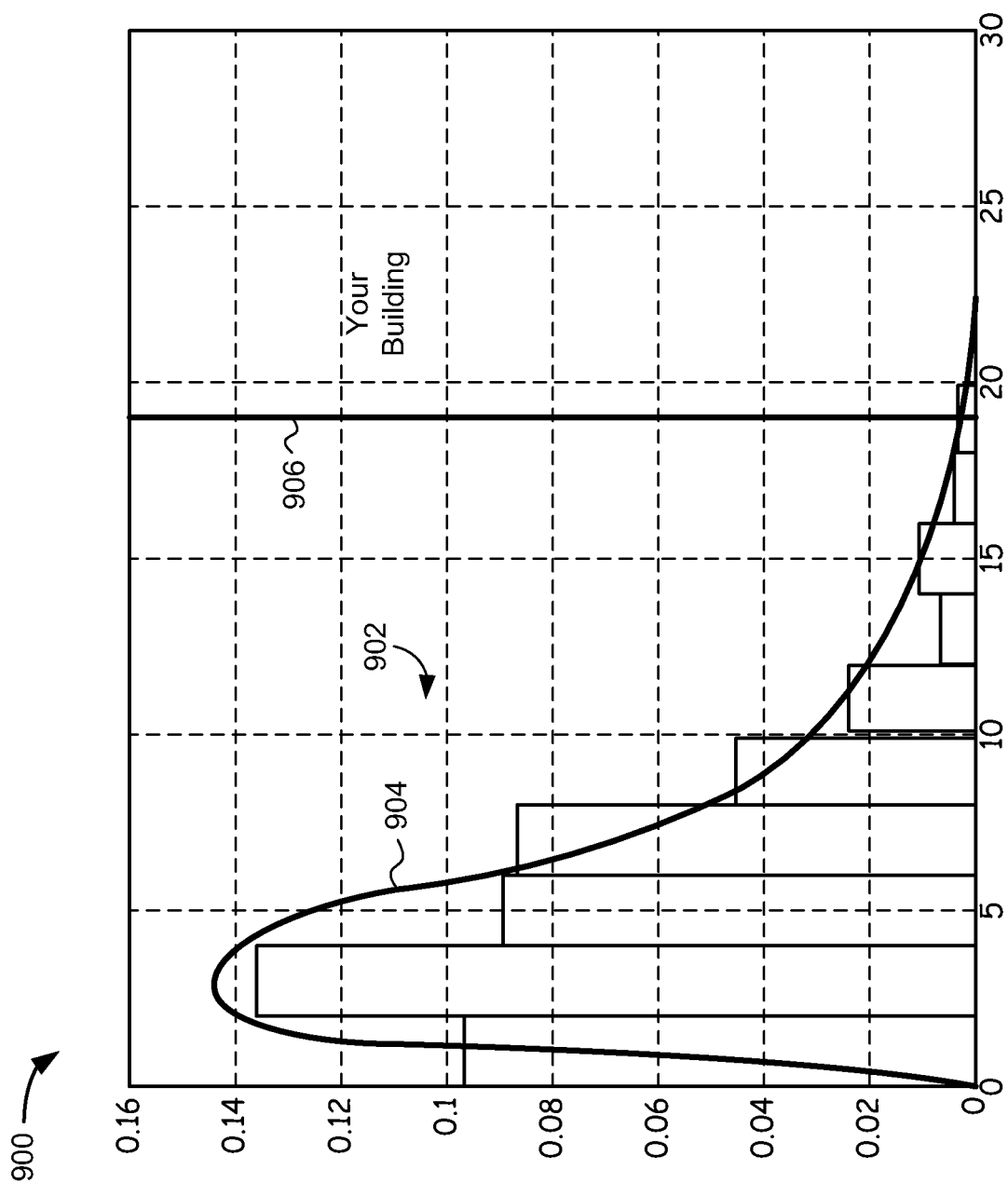
FIG. 9 is an illustration of an example report comparing a building's energy use model parameters to those of other buildings, according to one embodiment.

Referring now to FIG. 9, an illustration is shown of an example report 900 comparing a building's energy use model parameters to those of other buildings, according to one embodiment. As shown, report 900 includes a probability distribution function 902 of Mahalanobis distances for a building under study and a set of other buildings having the same classification. In general, the Mahalanobis distance for a building represents the distance between the building's data points and the typical building in the set. Probability distribution function 902 may follow a Hotelling's T-squared distribution 904 having an ellipsoidal envelope. Report 900 may also include indicia 906 regarding the Mahalanobis distance for a building under study as it relates to probability distribution function 902. In general, the greater the Mahalanobis distance for a building, the further the building's data varies from that of the typical building in its class. For example, indicia 906 may be inspected to determine that the building under study is a good candidate for ECMs or is experiencing an equipment fault.

In some embodiments, generated report 900 may include information regarding an outlier building detected by comparing the distance between a building's data point and those of other buildings. A building having a distance greater than a critical value may then be identified as being an outlier. For example, a critical value may correspond to a Mahalanobis distance of greater than a value V. In some embodiments, multiple hypothesis tests may be used to correct the distribution of distances. For example, multiple hypothesis tests may be used to detect outliers that are good candidates for ECMs or to limit false alarms during fault detection.

Figure 10:
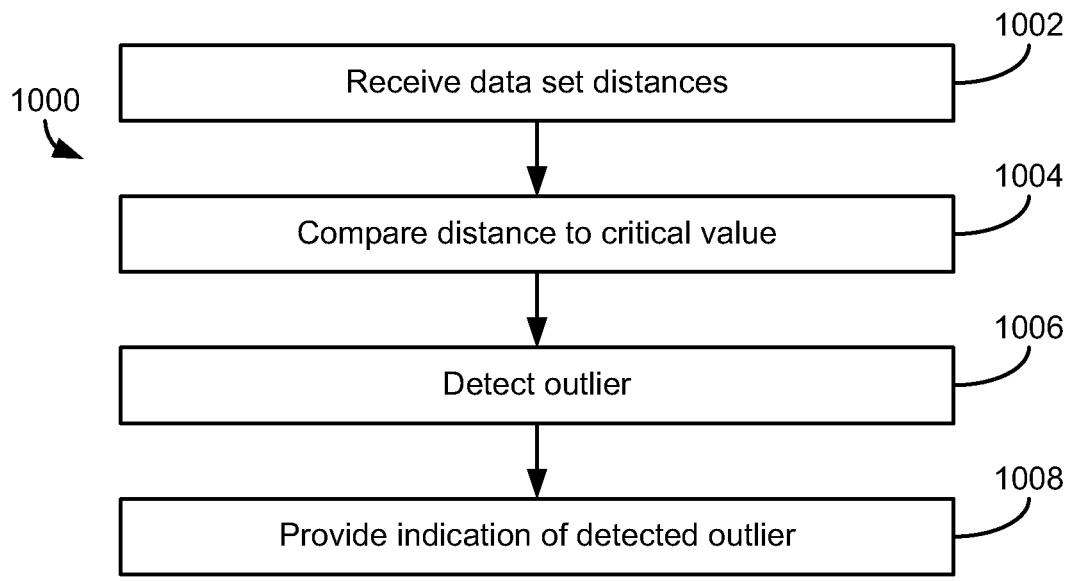
FIG. 10 is a flow chart of a process for identifying an outlier data point, according to one embodiment.

Referring now to FIG. 10, a flow chart of a process 1000 for identifying an outlier data point is shown, according to one embodiment. Process 1000 may be implemented by one or more computing devices, such as a data acquisition and analysis service. In general, an outlier may be detected by comparing the data points for a building under study to those of other buildings in its class. For example, parameters for a building's energy use model may be compared to determine their statistical distances. These distances may then be compared to a critical value (e.g., a threshold value). Based on the comparison, a building having a distance greater than the critical value may be identified as being an outlier. Process 1000 may be used to detect outliers using univariate statistical analysis or multivariate statistical analysis, according to various embodiments.

Process 1000 includes receiving data set distances (step 1002). In one embodiment, the data set distances may be received at a processing circuit (e.g., from another computing device or from a local software module being executed by the processing circuit). In general, the distances correspond to the statistical or geometric distances between the data values for the buildings being analyzed (e.g., a building under study and one or more other buildings in its class). For example, the data set distances may be Mahalanobis distances calculated for the buildings being compared. In other examples, other distances may be received, such as geometric distances to a centroid or distances determined via hierarchical clustering. According to one embodiment, the distances generated in process 800 may be received and analyzed in process 1000.

Process 1000 includes comparing one or more of the received distances to a critical value (step 1004). Generally, a critical value refers to a threshold value that functions as the dividing line between outlier buildings and those within the cluster of normal buildings. In some embodiments, if the distances follow a distribution with curves of equal value of the probability distribution function that form hyperellipsoids, such as Hotelling's T-squared distribution, a critical value may be determined using an inverse T-squared distribution or F-distribution (e.g., a scaled T-squared distribution).

Process 1000 includes detecting an outlier (step 1006). Based on the comparison between the distance for a building and the critical value used, the building may be identified as being an outlier among the buildings being analyzed. For example, if the statistical distance between the data set for a building under study and the average building in its class is greater than the critical value, the building may be considered an outlier.

Process 1000 includes providing an indication of the detected outlier (step 1008). In some embodiments, the indication may be part of a generated report and provided to an electronic display. For example, a plot of distances between data sets for different buildings may include an indication of which buildings are statistical outliers. In some cases, one or more bivariate scatter plots may be included in a generated report for the detected outlier. For example, if the building's energy use model includes five variables, two of those variables may be plotted as part of a generated report.

A generated report may include financial information regarding the outlier, such as an energy use cost of the building. For example, a generated report may include information regarding monetary expenditures associated with the building's energy consumption. A building's energy use cost may also be relative to the other buildings in its class. For example, the data set distance for the building used in step 1004 may correspond to an additional expenditure over that of the other buildings in the set. In such a case, the additional expenditure may also be included in a generated report (e.g., to quantify the additional financial cost caused by the building being an outlier among its class).

In further embodiments, the indication may be provided to another software module or other computing device, for further analysis. For example, an indication of a detected outlier may be provided to another electronic device so that a technician may diagnose why the building is an outlier among its class. In another example, an indication of the detected outlier may be provided to a fault detection module configured to diagnose why the building is an outlier. The module may, for example, analyze any outlier variables for the building and suggest potential causes for the outlier variables. For example, such a fault detection module may suggest an abnormally high ventilation as a potential cause of the building having an outlier cooling balance point.

Proxying an Energy Use Model Parameter

In general, lean energy analysis attempts to model a building's energy use using readily available data. For example, a building's energy use may be modeled using readily available data such as billing data from the utility that supplies energy to the building. Using readily available data for lean energy analysis or for measurement and verification may facilitate the analysis of a building's energy use without conducting an expensive energy audit, or installing additional instrumentation onsite. However, many factors affecting a building's energy use may not be readily available. According to various embodiments, readily available data may be used as a proxy for such a factor within the building's energy use model.

One factor that may affect a building's energy use and may not be readily available is the building's occupancy. In some cases, occupancy data may be available via the building's security systems. For example, a building may have an installed security system that controls access by requiring those entering or exiting the building to enter a pass code or swipe a security badge. In other cases, however, some or all of the building may be unsecured, allowing the public to enter and exit at will.

In various embodiments, a building's water consumption may be used as a proxy for the building's occupancy. In keeping with the principles of lean energy analysis (e.g., modeling a building's energy consumption using as much readily-available data as possible), data regarding a building's water consumption may be used as a proxy for the building's occupancy, which may be more difficult or expensive to determine. For example, the building's water consumption may be available as part of the billing data from the utility that supplies water to the building. Similar to weather-related data for the building, the water consumption may be used as an additional factor within the building's energy use model (e.g., as a proxy for the building's occupancy). When using water as a proxy for occupancy, the water use attributable to the other energy use model parameters may be ignored. For example, a building may consume a portion of water to help cool the building and another portion due to the building's occupancy. In such a case, the portion of water use to cool the building may be ignored in the building's energy use model. While water and occupancy are primarily discussed herein to illustrate the use of one form of building data as a proxy for another, any number of other building model parameters may also be proxied using other forms of building data in a similar manner.

Figure 11:
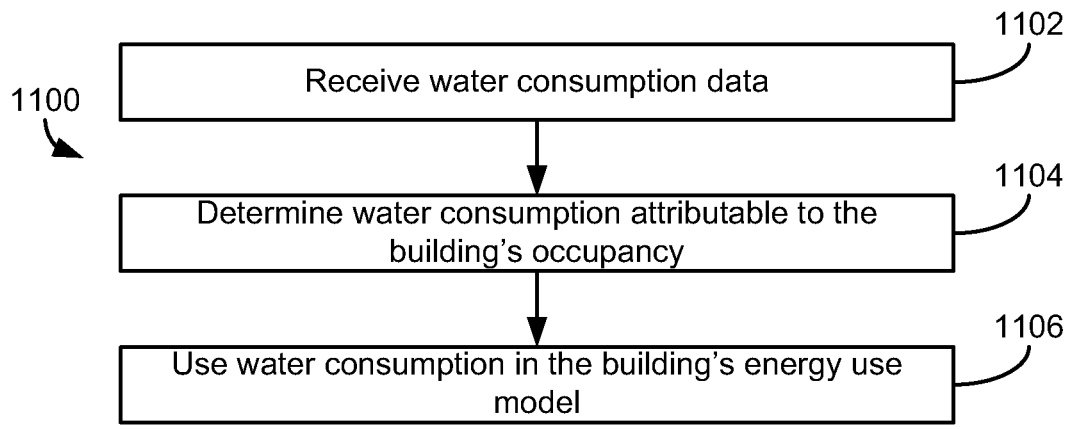
FIG. 11 is a flow chart of a process for using a building's water use as a proxy for the building's occupancy in an energy use model, according to one embodiment.

Referring now to FIG. 11, a flow chart of a process 1100 for using a building's water use as a proxy for the building's occupancy in an energy use model is shown, according to an exemplary embodiment. In general, data regarding a building's water consumption may be more readily available than the building's occupancy, allowing the energy use model to be generated in accordance with the principles of lean energy analysis. In other embodiments, the building's water use and occupancy may be replaced in process 1100 with another type of building data and model parameter, to proxy another energy use model parameter. Process 1100 may be implemented by one or more computing devices, such as by a data acquisition and analysis service, by a building's control system, etc. Process 1100 may also be implemented alone or in conjunction with either of processes 300 or 800.

Process 1100 includes receiving water consumption data (step 1102). The water consumption data may be received from any number of sources. For example, the water consumption data may be received from the utility that supplies water to the building. In another example, the water consumption data may be received from a database or other memory storage mechanism. The water consumption data may also be from any period of time. For example, the water consumption data may include the building's water consumption in the past week, month, year, or over multiple years.

Process 1100 includes determining the portion of the building's water consumption attributable to the building's occupancy (step 1104). In general, a building's total water consumption may include a portion attributable to its occupancy and a portion attributable to its various building systems. For example, a building's HVAC system may include one or more cooling towers used to dissipate heat removed from the building's chiller. Such a cooling tower may use water, regardless of the building's current occupancy. In another example, a portion of a building's water consumption may be attributable to lawn sprinklers located outside of the building.

In one embodiment, the portion of a building's water consumption not attributable to its occupancy may be quantified. For example, sensor data from the building's chiller, sprinkler system, etc., may be used to quantify the portion of water consumption that is not attributable to the building's occupancy. The resulting consumption may then be subtracted from the building's total consumption, to determine the portion of the water consumption attributable to the building's occupancy. In other embodiments, the portion of the building's water consumption not attributable to its occupancy may be estimated. For example, water consumption by a building's cooling tower may be estimated using data regarding the operation of the building's HVAC system (e.g., whether the HVAC system is in a cooling mode, etc.).

In a further embodiment, only water consumption that is orthogonal to other parameters used in the building's energy use model may be used as a proxy for the building's occupancy. Since a portion of the building's water consumption may be correlated to the other parameters used in the energy use model (e.g., an HVAC-related parameter), only the portion that is uncorrelated to the other model parameters may be used in the model. Applying this method of orthogonalization to the water consumption allows water to be used to reduce model inaccuracies caused by variable occupancy without affecting other model parameters (e.g., $\rho_{CDD}$). This is important for the benchmarking portion of lean energy analysis as buildings for which water is available can still be compared to buildings for which water is not available.

Process 1100 also includes using the water consumption in the building's energy use model (step 1106). In various embodiments, the building's energy use may be modeled as follows:

$$E = \beta_0(\#days) + \beta_1(CDD) + \ldots + \beta_n(R_w) + \epsilon$$

where E is the dependent variable representing the energy use (e.g., measured in kilowatt-hours), CDD is a cooling degree day parameter, $\beta_i$ is a parameter vector, PD is a person day value representing the building's occupancy, and E is an error factor (e.g., a noise factor). In general, the PD value in the energy use model may represent the total number of people present in the building over a course of time. For example, if the building is occupied for 250 days out of the year by three people, its person-days parameter is 750 for the year. In one embodiment, the PD value may be obtained by multiplying the building's water consumption attributable to its occupancy by an average water consumption per person value. For example, if it is known that the average occupant consumes 3 gallons of water while in the building and that 30 gallons of water attributable to the building's occupants were used in a given day, it can be estimated that the building had ten occupants on that day (e.g., by dividing the consumption by the consumption per occupant value). The energy use model may then be solved using regression or a similar technique, to determine the building's energy use (E) and $\beta_i$ values.

In a further embodiment, the term in the model proportional to the number of person days is replaced by its proxy directly in the energy use model. In this embodiment the proxy is determined by the portion of the water use uncorrelated to the other independent variables in the model, $R_w$. In this case the energy use model is given by:

$$E=\beta_0(\#days)+\beta_1(CDD)+ \ldots +\beta_n(R_w)+\epsilon$$

Figure 12:
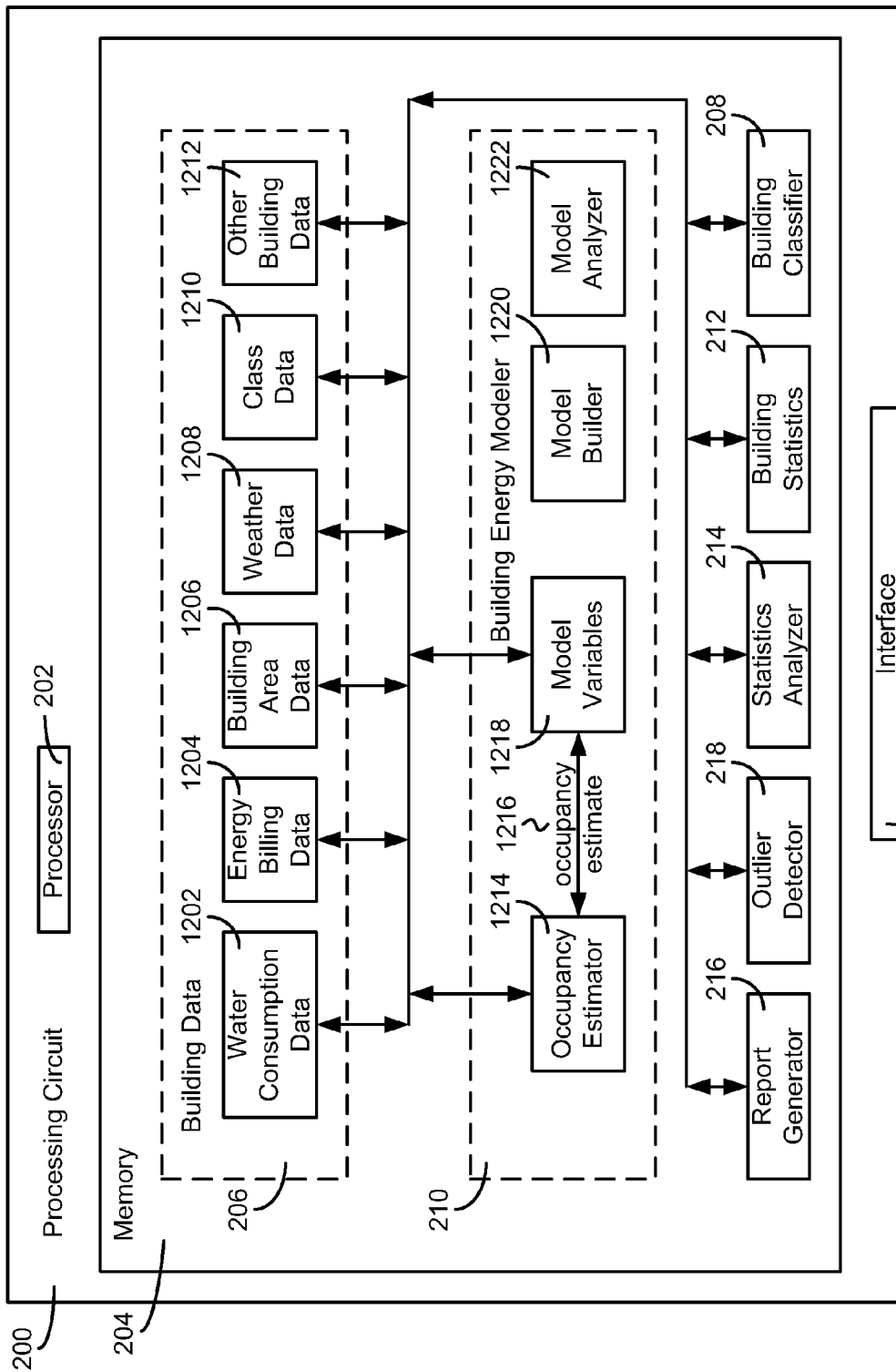
FIG. 12 is a detailed block diagram of the processing circuit of FIG. 2 configured to model a building's energy use using the building's water consumption, according to various embodiments.

Referring now to FIG. 12, a detailed block diagram is shown of processing circuit 200 of FIG. 2 configured to model a building's energy use using its water consumption, according to various embodiments. As shown, building data 206 may include various forms of data that may be used to model a building's energy use. Building data 206 may be received from one or more sources via interface 220. For example, some of building data 206 may be received from another computing device via a network. Some of building data 206 may also be received via interface 220 from a user interface device, such as a touch-screen display or keyboard.

Building data 206 may include water consumption data 1202. Water consumption data 1202 generally indicates the amount of water consumed by a particular building. Water consumption data 1202 may include data from any time period or set of time periods. For example, water consumption data 1202 may include a history of water consumptions over the previous week, month, year, or the lifetime of the building. Water consumption data 1202 may also include billing data from the utility that provides water to the building. Such billing data may be received, for example, from the utility itself or from the building's water meter. In some embodiments, water consumption data 1202 may include data regarding the water consumption by certain equipment in the building. For example, water consumption data 1202 may also include data regarding how much water is consumed by the building's HVAC system.

Building data 206 may include energy billing data 1204. Similar to water consumption data 1202, energy billing data 1204 may include data received from the utility that provides electricity to the building, a utility meter that measures the building's energy use, entered via a user interface device, or from another source. In general, energy billing data 1204 may include data regarding a building's energy consumption, energy demand, billing rates, total energy costs, etc. Energy billing data 1204 may include data from any time period.

Building data 206 may include building area data 1206 indicative of the building's internal area. In one embodiment, building area data 1206 may be used to normalize energy use parameters across the buildings in a class. For example, a building's energy use may be normalized by dividing its total energy use by its square footage in building area data 1206.

Building data 206 may also include weather data 1208. Weather data 1208 may include actual weather data measured at a building. For example, weather data 1208 may include recorded outdoor air temperatures, outdoor humilities, etc., measured at a building. Weather data 1208 may also include historical data for a particular location. For example, weather data 1208 may include TMY data.

Building data 206 may include class data 1210. Class data 1210 includes data regarding a particular building that may be used to classify the building and select similar buildings for comparison. For example, class data 1210 may include data regarding a building's usage type (e.g., whether the building is a school, data center, etc.). Class data 1210 may also include data regarding a building's location (e.g., the building's address, geographic coordinates, city, region, etc.). Location information may be used by processing circuit 200, for example, to retrieve weather data for the building's location from weather data 1208. For example, if the building is located in New York City, TMY2 data for New York City may be retrieved from weather data 1208. Class data 1210 may further be used by building classifier 208 to classify a building under study and to identify one or more other buildings in its class.

Building data 206 may further include other building data 1212. Other building data 1212 may include, for example, data from a building's HVAC system (e.g., a temperature set point, an outdoor airflow measurement, etc.), security system (e.g., camera data, security checkpoint data, etc.), data networking component, or other equipment installed in the building. Other building data 1212 may be used by building energy modeler 210 to model a building's energy use. Other building data 1212 may also be used by building classifier 208 to determine a building's class, by outlier detector 218 to determine an abnormal condition, or by report generator 216 to provide information regarding the building to an electronic display.

Building energy modeler 210 may include model builder 1220 configured to generate an energy use model for a building using model variables 1218. In one embodiment, model builder 1220 may generate a linear regression model using model variables 1218. In other embodiments, model builder 1220 may generate a non-linear energy use model using model variables 1218.

Model variables 1218 may include any of the data stored in building data 206. For example, model variables 1218 may include CDD or HDD data from weather data 1208 and energy use data from energy billing data 1204. In one embodiment, model builder 1220 may normalize model variables 1218. For example, an energy use value in model variables 1218 may be divided by a building's area from building area data 1206 to normalize the building's consumption (e.g., model variables 1218 may include a consumption per square foot value for the building).

In addition to data from building data 206, model variables 1218 may also include an occupancy estimate 1216 generated by occupancy estimator 1214 in building energy modeler 210. Occupancy estimate 1216 may be any occupancy-related value, such as a person-day (PD) value or an actual head count of persons that have occupied the building over a given time period. In one embodiment, occupancy estimator 1214 may receive actual data regarding the building's occupancy stored in other building data 1212. For example, occupancy estimate 1216 may be based in part on data from a building's security system (e.g., the number of people that swiped security badges, the number of people that that crossed security checkpoints, etc.). In some cases, an actual head count of a building's occupants may not be available or easily obtained. According to some embodiments, occupancy estimator 1214 may use water consumption data 1202 to generate occupancy estimate 1216, in addition to, or in lieu of, actual occupancy data.

Occupancy estimate 1216 generated by occupancy estimator 1214 may be based only on the portion of the building's water consumption that is attributable to the building's occupancy. In one embodiment, only water consumption data that is orthogonal to the rest of model variables 1218 may be used by model builder 1220. For example, assume that model builder models a building's energy use as follows:

$$E = \beta_0(\#\text{days}) + \beta_1(\text{CDD}) + \epsilon$$

where E is the dependent variable representing the building's energy use from energy billing data 1204, CDD is a cooling degree day parameter from weather data 1208, $\beta_i$ is a parameter vector, $\epsilon$ is an error factor. However, it is known that energy use is also occupancy driven. To increase the accuracy of the model one could use person days as an independent variable. Person days may not be readily available. In keeping with the principles of lean energy analysis water bill data is instead used as a proxy for person days. Since water consumption is also related to degree days, only the portion of the building's water consumption that is not related to the other model variables 1218 (i.e., the portion of water use orthogonal to the other independent variables) ($R_w$) may be used to generate occupancy estimate 1216. In this case, the model becomes:

$$E = \beta_0(\#\text{days}) + \beta_1(\text{CDD}) + \beta_2(R_w) + \epsilon$$

Using only the portion of the building's water consumption that is related to guarantees that the model parameters ($\beta$'s) for other building data will not be affected by the inclusion of the additional building data. Unchanged model parameters are necessary for benchmarking the data.

Similar to model builder 1220, occupancy estimator 1214 may generate a water use model for a building. For example, occupancy estimator 1214 may model the building's water consumption using OLSR, WLSR, etc., using the following:

$$W = \beta_{w,0}(\#\text{days}) + \beta_{w,1}(\text{CDD}) + \epsilon$$

where W is the building's water consumption from water consumption data 1202, CDD is a cooling degree day parameter from weather data 1208, $\beta_i$ is a parameter vector, and $\epsilon$ is an error factor. This formulation allows the one to estimate the portion of the water consumption that is dependent on the weather. In general, it is necessary to determine the portion of the proxy variable that is dependent on all other variables already included in the energy use model. If the energy use model contained additional parameters for heating degree days and the number of weekends in the period, these would also have to be included in the model for the water consumption.

In one embodiment, occupancy estimator 1214 may determine a residual of the water consumption model by performing regression on the water consumption model and solving for the following:

$$R_w = W - \beta_{w,0}(\#\text{days}) - \beta_{w,1}(\text{CDD})$$

where W is the building's water consumption from water consumption data 1202, CDD is a cooling degree day parameter from weather data 1208, $\beta_i$ is a parameter vector, and $R_w$ is the water consumption residual. Occupancy estimator 1214 then may output the water consumption residual ($R_w$) as occupancy estimate 1216. In response, model builder 1220 may use the residual in its generated energy use model energy use as follows:

$$E = \beta_0(\#\text{days}) + \beta_1(\text{CDD}) + \beta_2(R_w) + \epsilon$$

and provide the generated model to model analyzer 1222.

Model analyzer 1222 may be configured to solve an energy use model generated by model builder 1220 and generate building statistics 212. For example, model analyzer 1222 may determine a normalized annual consumption intensity ($I_{NAC}$) value and a $\beta$ intensity ($I_{\beta i}$) value obtained from the model by estimating the $\beta_i$ values. Therefore, in some embodiments, building statistics 212 may include a $\beta_W$ value (e.g., the $\beta_i$ value for $R_w$) and/or a corresponding intensity value ($I_{\beta W}$).

The process of finding the potion of a dependent variable that is orthogonal to all other dependent variables is useful not only when one variable is being used as a proxy for another, but also anytime an independent variable is added to the model. The process guarantees that the previous model parameters do not change and therefore a model with the additional independent variables can be compared to a model (from another building) without for which the additional independent variable was not available.

Any of building statistics 212 relating to occupancy estimate 1216 may be used by statistics analyzer 214, outlier detector 218, or report generator 216. For example, the value may be compared by statistics analyzer 214 to that of other buildings in the same class. Similarly, the value may be used by outlier detector 218 to determine whether the building is an outlier among its class. In various embodiments, the occupancy-related value in building statistics 212 may be used by statistics analyzer 214 and outlier detector 218 as part of a univariate or multivariate analysis. For example, statistics analyzer 214 may compare only the occupancy-related intensity values ($I_{\beta w}$) among the buildings in a class of buildings identified by building classifier 208. In another example, outlier detector 218 may use the occupancy-related values with other building statistics 212 (e.g., cooling slope values, cooling balance point values, etc.). Report generator 216 may also report on the occupancy-related value in a similar manner to any of the other values in building statistics 212. For example, report generator 216 may generate a bivariate scatter plot using a building's occupancy-related values.

Figure 13:
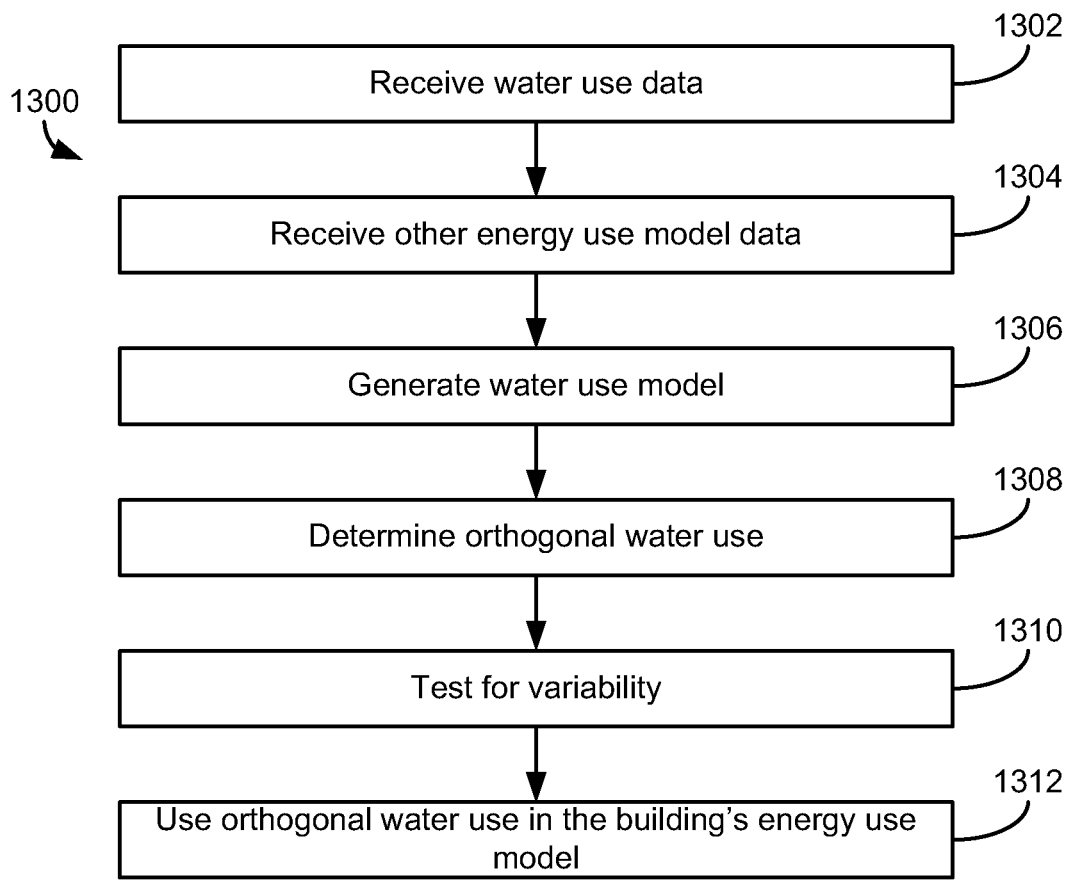
FIG. 13 is a flow chart of a process for determining a building's water use attributable to occupancy, according to one embodiment.

Referring now to FIG. 13, a flow chart is shown of a process 1300 for determining a building's water use attributable to occupancy, according to one embodiment. Process 1300 by implemented either alone or in conjunction with any of processes 300, 800, or 1100. Process 1300 may also be implemented by a processing circuit, such as a processing circuit of a data acquisition and analysis service, a building's control system, etc.

Process 1300 includes receiving water use data for a building (step 1302). The received water use data may include, but is not limited to, an actual water consumption, an estimated water consumption, a projected water consumption, or a financial expenditure for water. The water use data may be from a particular time period (e.g., the previous week, the month of March, a given year, etc.) or, in some cases, for the lifetime of the building. In some embodiments, the water use data may include data regarding the total water use by the building and some or all of its equipment. For example, the received water use data may include data regarding the water consumption by the building's HVAC system. The water use data may be received from a user interface device, such as a keyboard (e.g., entered by a user). The water use data may be received from a user interface device, such as a keyboard (e.g., entered by a user). In other cases, the water use data may be received from a computing via a network or from a local data storage device.

Process 1300 includes receiving other energy use model data (step 1304). Other energy use model data may include any data that affects the building's energy use. Exemplary energy use model data include, but are not limited to, weather data (e.g., CDD data, HDD data, etc.), heating or cooling data for the building (e.g., cooling balance point data, heating balance point data, etc.), and energy use or billing data (e.g., an actual energy consumption, a cost associated with the building's energy consumption, etc.). In other words, the other energy use model data may be used as inputs to the building's energy use model. Alternatively, data may be received to derive some or all of the energy use data. For example, data regarding the building's cooling load and cooling coefficient of ventilation may alternatively be received and used to calculate the building's cooling balance point.

Process 1300 includes generating a water use model (step 1306). In one embodiment, the water use model may be a regression model. Such a regression model may include both the received water use data and the other energy use model data. In other words, parameters used to model the building's energy use may also be used to model the building's water use. For example, one possible water use model is as follows:

$$W = \beta_{w,0}(\#days) + \beta_{w,1}(CDD) + \epsilon_2$$

where W is the building's water consumption from water consumption data 1202, CDD is a cooling degree day parameter from weather data 1208, $\beta_i$ is a parameter vector, and $\epsilon_2$ is an error factor. Any parameter used in the building's energy use model may be used in the water use model, such as a heating degree day parameter.

Process 1300 includes determining the building's water use that is orthogonal to the other energy use model parameters (step 1308). In other words, the amount of the building's water use that is not correlated to the other energy use model parameters may be determined. Such a water use may be assumed to be attributable to the building's occupancy (e.g., the amount of water used by occupants of the building). In one embodiment, the orthogonal water use may be determined by calculating a residual of the water use model. For example, the orthogonal water use may be determined as follows:

$$R_w = W - \beta_{w,0}(\#days) - \beta_{w,1}(CDD)$$

where W is the building's water consumption from water consumption data 1202, CDD is a cooling degree day parameter from weather data 1208, $\beta_i$ is a parameter vector, and $R_w$ is the water consumption residual.

Process 1300 optionally includes testing for variability in the building's occupancy-related water consumption (step 1310). In one embodiment, the variability in the building's occupancy-related water consumption may be determined by comparing the building's monthly water consumption attributable to its occupancy (i.e., the monthly water consumption orthogonal to the other building data). If the variability is low, the water consumption may not be used as an input to the building's energy use model. However, if the variability is high, the water consumption may be used to proxy the building's occupancy in the energy use model. In a further embodiment, the value in adding the occupancy-related water consumption can be determined using techniques such as stepwise regression.

Process 1300 includes using the orthogonal water use in the building's energy use model (step 1312). In one embodiment, the calculated orthogonal water use may be used directly in the building's energy use model. For example, the residual calculated in step 1308 may be used as a proxy in the energy use model for the building's occupancy. In other embodiments, the calculated orthogonal water use may be used indirectly in the building's energy use model. For example, one or more mathematical transformations may be performed on the residual and the result used in the energy use model. Exemplary transformations include operations to convert the residual into a related metric (e.g., converting a water use per person value into a person-day value, converting a water consumption into a water consumption cost, etc.).

Configuration of Various Exemplary Embodiments

Embodiments of the subject matter and the operations described in this specification can be implemented in digital electronic circuitry, or in computer software embodied on a tangible medium, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on one or more computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, or other storage devices). Accordingly, the computer storage medium may be tangible and non-transitory.

The operations described in this specification can be implemented as operations performed by a data processing apparatus on data stored on one or more computer-readable storage devices or received from other sources.

The term "client or "server" include all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube), LCD (liquid crystal display), OLED (organic light emitting diode), TFT (thin-film transistor), plasma, other flexible configuration, or any other monitor for displaying information to the user and a keyboard, a pointing device, e.g., a mouse, trackball, etc., or a touch screen, touch pad, etc., by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an embodiment of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific embodiment details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product embodied on a tangible medium or packaged into multiple such software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain embodiments, multitasking and parallel processing may be advantageous.

What is claimed is:

1. A method for using an energy use model of a building comprising:
   receiving, at a processing circuit, building data indicative of one or more characteristics of the building;
   generating, by the processing circuit, an energy use model for the building based on the building data;
   using the energy use model to generate statistics for the building, the statistics comprising one or more values derived from the energy use model;
   identifying, by the processing circuit, one or more other buildings having a same classification as the building, each of the one or more other buildings having associated statistics generated from energy use models;
   comparing, by the processing circuit, the generated statistics for the building to statistics for the identified one or more other buildings; and
   providing, by the processing circuit, an indication of the comparison.

2. The method of claim 1, further comprising:
   determining a classification for the building based on the one or more characteristics of the building.

3. The method of claim 1, wherein the energy use model comprises a regression model.

4. The method of claim 3, wherein the statistics for the building correspond to a normalized annual energy consumption intensity generated by driving the energy use model with typical meteorological year (TMY) data or to a parameter vector estimated using the energy use model.

5. The method of claim 1, wherein the generated statistics for the building are compared to a probability distribution function of the statistics for the identified one or more other buildings.

6. The method of claim 1, wherein the building data comprises a location of the building and the classification for the building is determined based in part on the location of the building.

7. The method of claim 1, wherein the building data comprises an indication of a usage type for the building and the classification for the building is determined based in part on the usage type.

8. The method of claim 1, further comprising:
determining a generated statistic to be an outlier using at least one of: the generalized extreme studentized deviate (GESD) test, Wilks' method, or cluster analysis.

9. The method of claim 1, wherein two or more of the generated statistics for the building are compared to two or more of the statistics for the other buildings using multivariate statistical analysis.

10. The method of claim 1, further comprising:
determining the building to be an outlier based in part on a Mahalanobis distance between the statistics for the building and the statistics for the one or more other buildings; and
providing, by the processing circuit, an indication of the determined outlier.

11. The method of claim 1, further comprising:
determining a generated statistic to be an outlier using at least one of: the generalized extreme studentized deviate (GESD) test, Wilks' method, or cluster analysis.

12. The system of claim 11, wherein the processing circuit is further operable to determine the building to be an outlier based in part on a Mahalanobis distance between the statistics for the building and the statistics for the one or more other buildings and to provide an indication of the determined outlier.

13. A system for using an energy use model of a building comprising a processing circuit operable to:
receive building data indicative of one or more characteristics of the building;
generate an energy use model for the building based on the building data;
use the energy use model to generate statistics for the building, the statistics comprising one or more values derived from the energy use model;
identify one or more other buildings having a same classification as the building, each of the one or more other buildings having associated statistics generated from energy use models;
compare the generated statistics for the building to statistics for the identified one or more other buildings; and
provide an indication of the comparison.

14. The system of claim 13, wherein the processing circuit is further configured to determine a classification for the building based on the one or more characteristics of the building.

15. The system of claim 13, wherein the energy use model comprises a regression model.

16. The system of claim 13, wherein the statistics for the building correspond to an annual energy consumption intensity generated by driving the energy use model using typical meteorological year (TMY) data or to a parameter vector estimated using the energy use model.

17. The system of claim 13, wherein the generated statistics for the building are compared to a probability distribution function of the statistics for the identified one or more other buildings.

18. The system of claim 13, wherein the building data comprises a location of the building and the classification for the building is determined based in part on the location of the building.

19. The system of claim 13, wherein the building data comprises an indication of a usage type for the building and the classification for the building is determined based in part on the usage type.

20. The system of claim 13, wherein two or more of the generated statistics for the building are compared to two or more of the statistics for the other buildings using multivariate statistical analysis.

21. A computer-readable storage medium having machine instructions stored therein, the instructions being executable by a processor to cause the processor to perform operations, the operations comprising:
receiving building data indicative of one or more characteristics of the building;
generating an energy use model for the building based on the building data;
using the energy use model to generate statistics for the building, the statistics comprising one or more values derived from the energy use model;
determining a classification for the building based on the one or more characteristics of the building;
identifying one or more other buildings having a same classification as the building, each of the one or more other buildings having associated statistics generated from energy use models;
comparing the generated statistics for the building to statistics for the identified one or more other buildings; and
providing an indication of the comparison.

22. The computer-readable storage medium of claim 21, wherein the statistics for the building correspond to an annual energy consumption intensity or a parameter vector estimated using the energy use model.

23. The computer-readable storage medium of claim 21, wherein the building data comprises at least one of a location of the building or an indication of a usage type for the building, wherein the classification for the building is determined based in part on the location of the building or the usage type for the building.

24. The computer-readable storage medium of claim 21, wherein the operations further comprise:
determining the building to be an outlier based in part on a Mahalanobis distance between the statistics for the building and the statistics for the one or more other buildings; and
providing an indication of the determined outlier.

* * * * *